US006789246B1

(12) United States Patent
Mohan et al.

(10) Patent No.: US 6,789,246 B1
(45) Date of Patent: Sep. 7, 2004

(54) METHOD AND APPARATUS FOR AUTOMATIC LAYOUT OF CIRCUIT STRUCTURES

(75) Inventors: Sunderarjan Mohan, Mountain View, CA (US); Xiling Shen, Stanford, CA (US)

(73) Assignee: Barcelona Design, Inc., Newark, CA (US)

(*) Notice: Subject to any disclaimer, the term of this patent is extended or adjusted under 35 U.S.C. 154(b) by 26 days.

(21) Appl. No.: 10/119,326

(22) Filed: Apr. 7, 2002

(51) Int. Cl.[7] .............................................. G06F 17/50
(52) U.S. Cl. ............................. 716/11; 716/8; 716/9; 716/10
(58) Field of Search ....................... 716/1–18; 326/42; 257/202–206; 703/14

(56) References Cited

U.S. PATENT DOCUMENTS

| 5,055,716 A | * | 10/1991 | El Gamel ................. 326/42 |
| 5,289,021 A | * | 2/1994 | El Gamal ................. 257/206 |
| 5,754,826 A | * | 5/1998 | Gamal et al. ............. 703/14 |
| 6,311,315 B1 | | 10/2001 | Tamaki |
| 6,539,533 B1 | * | 3/2003 | Brown et al. ............. 716/17 |
| 6,574,786 B1 | * | 6/2003 | Pohlenz et al. ........... 716/17 |
| 6,578,179 B2 | * | 6/2003 | Shirotori et al. .......... 716/3 |
| 6,581,188 B1 | | 6/2003 | Hosomi et al. |

FOREIGN PATENT DOCUMENTS

WO       WO01/37429 A1     5/2001

* cited by examiner

*Primary Examiner*—Vuthe Siek
(74) *Attorney, Agent, or Firm*—Blakely, Sokoloff, Taylor & Zafman LLP

(57) ABSTRACT

A method is described that involves retrieving a generic layout description of a circuit structure from a first database that stores a plurality of generic layout descriptions. The method also involves retrieving a foundry design rule profile of a semiconductor manufacturing process from a second database that stores a plurality of semiconductor manufacturing process design rule profiles. The method also involves automatically generating a layout of the circuit structure that conforms to the foundry design rule

67 Claims, 27 Drawing Sheets

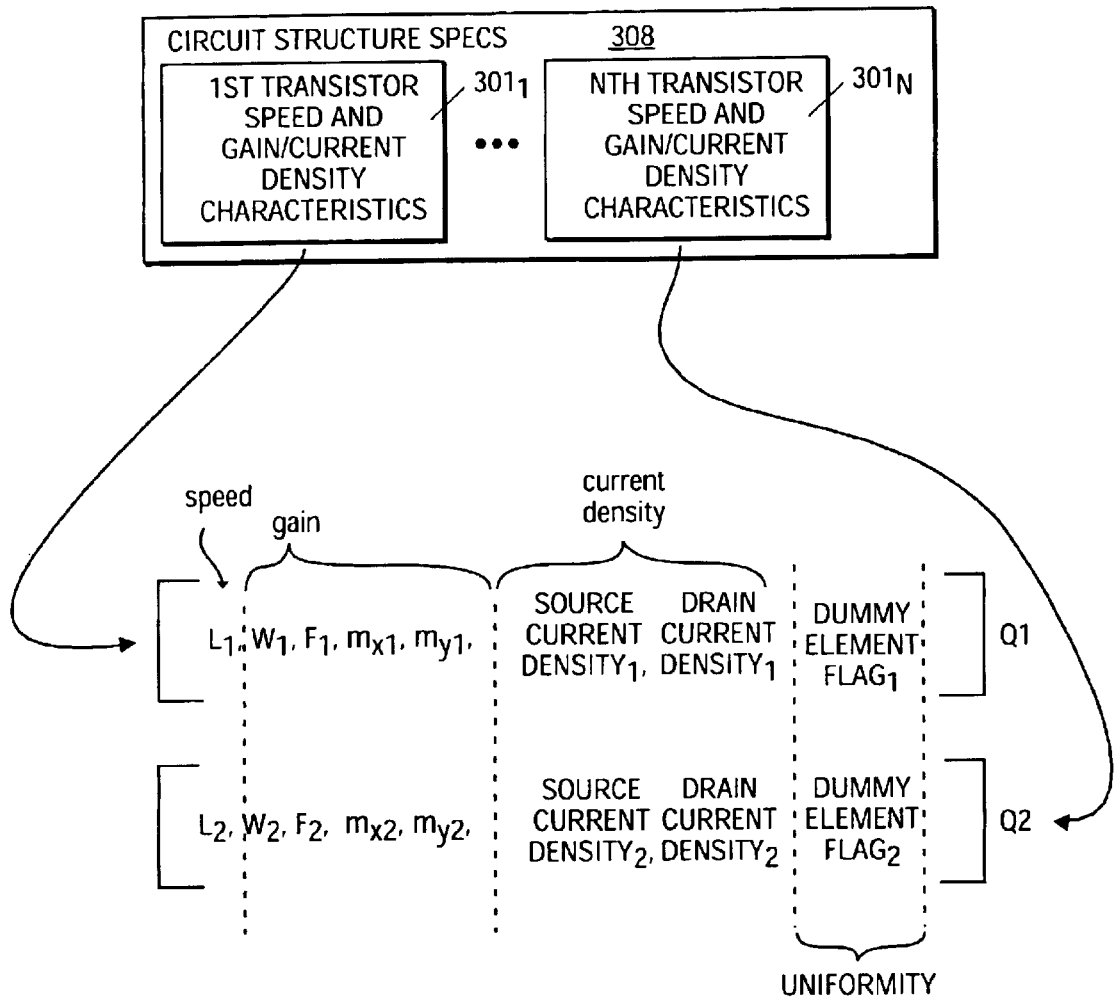
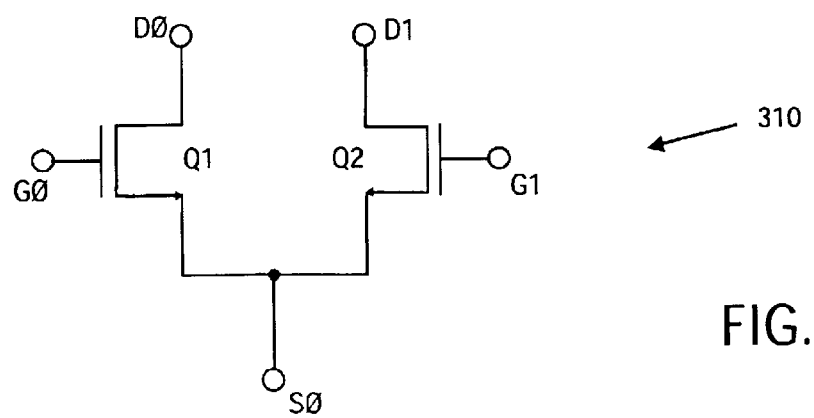
FIG. 3

|  | Label | Description |
|---|---|---|
|  | odspace | The minimum spacing between two active regions |
| 2114— | poextOd | The minimum length that the poly has to extend beyond the active |
|  | poSpace | The minimum spacing between two poly layers |
| 2113— | poWidth | The minimum width of poly |
|  | poClrOd | The minimum spacing between active area and poly which does not |
| 2118— | npExtOd | The minimum margin that n implant area has to enclosure active |
|  | npExtPo | The minimum length n implant area has to extend over poly. |
| 2117— | ppExtOd | The minimum margin that p implant area has to enclosure active |
|  | ppExtPo | The minimum length that p implant area has to extend over poly. |
| 2121, 2115— | coWidth | The width of the contact/via |
| 2120— | coSpace | The minimum space between the contacts |
| 2119— | odExtCo | The minimum enclosure of the active area over the contacts. |
| 2116— | poExtCo | The minimum margin that poly has to enclosure the contacts. |
|  | coClrPo | The minimum space between poly and non-poly contacts |
| 2105— | m1Width | The minimum width of metal1 |
| 2106— | m1Space | The minimum spacing between two metal1 wire |
|  | m1Space2 | The minimum spacing between two wide metal1 wire |
| 2112— | m1ExtCo | The minimum enclosure of metal1 over metal1 contact. |
| 2111— | m1EndExtCo | The minimum enclosure of the end of metal1 wire over metal1 contact |
| 2108— | via1Width | The width of via1 (between metal1 and metal2) |
| 2110— | m1ExtVia1 | The minimum enclosure of metal1 over via1 |
| 2109— | m1EndExtVia1 | The minimum enclosure of the end of metal1 wire over via1 |
| 2104— | via1Space | The minimum spacing between two via1s |
| 2107— | m2Width | The minimum width of metal2 |
| 2102— | m2Space | The minimum spacing between two metal2 wire |
| 2101— | m2ExtVia1 | The minimum enclosure of metal2 over via1. |
| 2103— | m2EndExtVia1 | The minimum enclosure of the end of metal2 wire over via1 |
|  | m1Area | The minimum area of a metal1 wire |
|  | nWellSpace | The minimum spacing between two Nwells |

FIG. 20

METHOD AND APPARATUS FOR AUTOMATIC LAYOUT OF CIRCUIT STRUCTURES

FIELD OF INVENTION

The field of invention relates generally to circuit design and semiconductor manufacturing; and, more specifically, to a method and apparatus for automatically laying out a circuit structure.

BACKGROUND

Transistor Technology

FIGS. 1a through 1c relate to transistor technology. Transistors are fundamental units of current and/or voltage control in a semiconductor device. As electronic devices (e.g., semiconductor chips) process information by controlling applicable currents and/or voltages (e.g., in digital applications, cutting off current flow so as to represent a binary "0" while allowing current to flow so as to represent a binary "1"), transistors are the fundamental electronic units by which currents and/or voltages are controlled so as to effectively process information.

A semiconductor chip is typically formed by integrating up to millions (and perhaps someday billions) of transistors onto a single "chip" of semiconductor material (e.g., silicon (Si)). By so doing, vast quantities of information can be electronically processed at high speed within relatively small (e.g., thumbnail sized) devices. FIG. 1a shows a standard depiction of what a transistor 101a may "look-like" in schematic form (e.g., as drawn by electrical engineers when designing a circuit at the transistor level of detail). FIGS. 1b and 1c show how the transistor 101a of FIG. 1a may be constructed with specific metal traces (amongst other features) that are formed over or upon the surface of semiconductor material.

Referring to FIG. 1a (which shows a specific type of transistor referred to as an N type Metal Oxide Semiconductor Field Effect Transistor (MOSFET)), note that a transistor typically has three nodes 102a, 103a, 104a. Generally, one node is used to help control whether or not (and if so, how much) current is allowed to flow between the other two nodes. Accordingly, node 102a (which is often referred to as a "gate" node) corresponds to the first node described above; and, nodes 103a and 104a correspond to the other two nodes described above (which are often referred to as the "drain" and "source" nodes, respectively)

The transistor 101a of FIG. 1a is designed from the perspective that current is designed to flow "into the drain" node 103a and "out of the source" node 104a. Thus, current flow 110 corresponds to a typical flow of current that may pass through transistor 101a. Here, as electrical current corresponds to a "flow" of electrons (which may be viewed, to some extent, as behaving similar to a flow of water); and, as electrons are negatively charged, current flow (in terms of a flow of positive charge) is opposite in direction to the flow of electrons. Thus, when current is flowing "into" the drain node 103a and "out of" the source node 104a as depicted by current flow 110; in actuality, electrons are flowing from the source node 104a to the drain node 103a according to electron flow 111.

Here, the terminology used for the transistor nodes are readily understandable if the transistor is analogized to a kitchen sink. That is, the transistor has a "source" of electrons from which electrons flow into the transistor (e.g., like a faucet acts as a source of water that flows into a sink), a "drain" that collects the flow of electrons to remove electrons from the transistor (e.g., like a drain that acts to empty the flow of water from a sink); and, a "gate" for controlling the magnitude of the electron flow (i.e, the amount of current) (e.g., as the position of a water faucet handle or knob controls the flow of water into a sink). Generally, the magnitude and polarity of voltage applied to the gate node 102a (with respect to the source node 104a) determines the magnitude of electron flow for the transistor 101a if its current flow 110 is not otherwise constrained or controlled (e.g., by other transistors to which transistor 101a is coupled).

FIGS. 1b and 1c describe how the transistor 101a of FIG. 1a can be manufactured over/upon an area of semiconductor material according to two different topological perspectives. Here, FIG. 1b corresponds to a "top view" of a transistor (i.e., looking down over a the semiconductor surface 105b); while, FIG. 1c corresponds to a "cross section" of a transistor (i.e., looked at from the side of the transistor itself.). Referring to both FIGS. 1b and 1c, the source node 104a of FIG. 1a is constructed with source wiring 104b, 104c; the drain node 103a is constructed with drain wiring 103b and drain contact 107b, 107c; and the gate node 102a of FIG. 1a is constructed with gate wiring 102b1, 102c1, gate via 106b, 106c, and gate structure 102b2 and 102c2. Note that, as a characteristic of MOS devices (Referring to FIG. 1c), a layer of oxide 112c resides between the gate structure 102c2 and the semiconductor material 105c.

If electrons are to flow according to the electron flow 111 observed in FIG. 1a, referring now to FIG. 1b and 1c, electrons will flow from source wiring fingers 104b1 and 104b2. Here, electrons will flow within diffusion region 108b: 1) from source wiring finger 104b1 beneath gate finger 102b2a to drain contact 107b, 107c (i.e., in the +x direction); and, 2) from source wiring finger 102b2a beneath gate finger 104b2b toward drain contact 107b, 107c (i.e., in the −x direction). The diffusion region 108b (and 108c of FIG. 1c) is a conducting region of the semiconductor surface 105b that is more conducting that the surrounding semiconductor surface area outside the diffusion region.

The diffusion region 108b, 108c is typically formed by implanting "dopant" or "impurity" atoms (e.g., Boron (B), Phosphorous (P)) into the semiconductor surface so as to improve its electrical conductivity (e.g., which, in effect, converts the "semi-conductor" to a material that is more akin to a "conductor" within the diffusion region 108b, 108c). The formation of a diffusion region 108b, 108c helps keep transistors isolated from one another by limiting their conducting regions to specified regions within the semiconductor material. The diffusion region 108b, 108c is also frequently referred to as an "active region", "an active device region", "an implant region" and the like.

Note that two different paths are created for the transistor's "source-to-drain" electron flow 111. The use of two different paths effectively allows the transistor to be "packed" into a dense structure which provides, in turn, additional space on the semiconductor surface 105b (e.g., where additional transistors may be formed). As such, the use of two different electron flow paths tends to optimize the efficiency of the semiconductor surface area that is consumed by the transistor devices formed thereon. Continuing then with a discussion of electron flow through the transistor, once electrons reach the drain contact (from either direction) they flow "up" the drain contact 107b, 107c (i.e., in the +z direction) and then along drain wiring 103b, 103c (along the x axis).

Note that the amount of electrons available for flow (e.g., which is directly related to the amount of current flow through the transistor) is largely controlled by the voltage established between the gate fingers 102b2a and 102b2b and their respective source fingers 104b1 and 104b2 (i.e., the voltage between fingers 102b2a and 104b1 helps determine the electron amount that flows in the +x direction; and, the voltage between fingers 102b2a and 104b2 helps determine the electron amount that flows in the −x direction). Such a voltage, when applied along gate wiring 102b1, should appear along the entire gate structure 102b2 (including gate fingers 102b2a and 102b2b) because of the electrical conductivity provided by gate via 106b, 106c).

Given this description, referring to FIG. 1b, it is clear that source wiring 104b and fingers 104b1, 104b2; drain contact 107b and wiring 103b; and gate structure 102b2 and wiring 102b1 and via 106b are made of conducting materials. Frequently, "wiring", vias and contacts are made of metal (such as Aluminum (Al), Copper (Cu), Tungsten, etc.) or metal alloys. Note that the source wiring 104b runs over the surface of the semiconductor material as a form of "local interconnect" that, for example, may be made with material(s) from which contacts are also made. The gate structure 102b2 is often made of silicon that is deposited onto the oxide layer 112c (referring briefly to FIG. 1c) and doped (similar to the diffusion region 108b) so as to become highly conductive. Because of the deposition process employed in forming gate structure 102b2, the gate structure 102b2 typically possesses a polycrystalline microstructure which causes it to be frequently referred to in the art as the "poly layer" 102b2 or simply the "poly" 102b2.

Before continuing it is important to emphasize that "other" types of transistors may be formed as the discussion above referred to just one type of transistor (i.e., an embodiment of an N type MOSFET transistor). The discussion above is also highly relevant to the formation of a P type MOSFET transistor (wherein an important distinguishing feature is that N type MOSFET transistors receive an "acceptor" type impurity in the diffusion region 108b whereas P type MOSFET transistors receive a "donor" type impurity in the diffusion region 108b). Other types of transistors include bipolar, MESFET, and heterostructure transistors. Furthermore, as transistor manufacturing is an evolving process, various materials or other features are expected to change over time (e.g., by replacing oxide 112c layer with a higher K dielectric material as just one example).

LIST OF FIGURES

The present invention is illustrated by way of example and not limitation in the figures of the accompanying drawings, in which like references indicate similar elements and in which:

FIG. 3 illustrates an embodiment of a circuit structure specification;

FIG. 20 shows a depiction of some elements that may be referred by a semiconductor manufacturing process description that is organized according to a standardized format;

Detailed Description 1.0 Foundry Design Rules

A discussion of transistor technology was provided in the background section in order to give the reader an appreciation for the complexity that is involved with respect to transistor layout and design. Semiconductor chip manufacturers (e.g.; IBM, TI, TSMC, etc.), which are also referred to as "foundries", are responsible for determining the appropriate recipe (i.e., "manufacturing process" or simply "process") by which their transistors are to be made according to. Given that (because of its complexity) transistor formation is at the leading edge of electronics research and development, semiconductor chip manufacturers typically employ highly specialized engineers and scientists in order to develop their particular manufacturing process.

Here, as the same or similar technical/economical problems faced by all semiconductor manufacturers (when trying to determine a process for a particularly sized transistor) may be solved according to different strategies or techniques, semiconductor manufacturing processes are almost always different (in varying respects) from one another from semiconductor manufacturer to semiconductor manufacturer. For example, a first semiconductor manufacturer may employ Copper based drain wiring 103*b* (e.g., for better packing density) whereas a second semiconductor manufacturer may employ Aluminum based drain wiring 103*b* (e.g., for cheaper manufacturing costs).

The specific differences between different manufacturing processes can be easily seen by comparing a set of rules (referred to as "foundry design rules", "design rules", "ground rules", etc.) associated with each process. A set of foundry design rules are issued by a semiconductor manufacturer to one or more circuit designers (or circuit design teams) that seek to design a circuit that will be manufactured by the manufacturer's process. Here, the design rules act as a set of constraints (e.g., frequently in terms of minimum or maximum dimensions or ranges) that the circuit designer(s) should adhere to when designing the layout of their circuit (if the circuit is to behave as designed; or, yield at all).

Generally, circuit designers who design circuits at the transistor level "get involved" into the details as to how their particular transistors will be layed out on the semiconductor surface. Better said, a circuit designer who designs circuits at the transistor level is usually responsible for defining the particular wiring dimensions, finger lengths, finger widths, etc. that will be used to implement their particular circuit. As such, the layout of the individual transistors is part of the design of a circuit that the designer is responsible for defining.

Figures 1A, 1B:
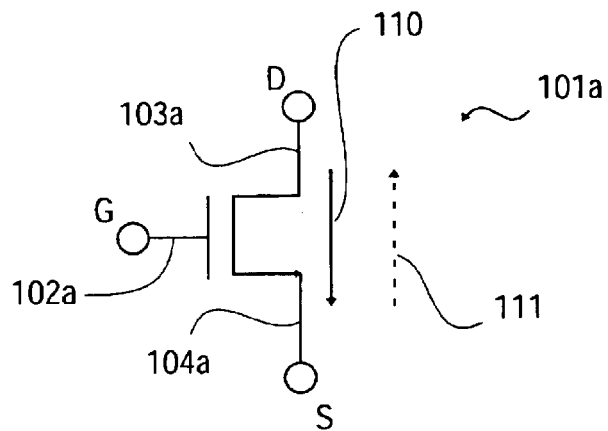
FIG. 1A is a schematic representation of a transistor.
FIG. 1B is a top view of an exemplary layout of the transistor.
Figure 1C:
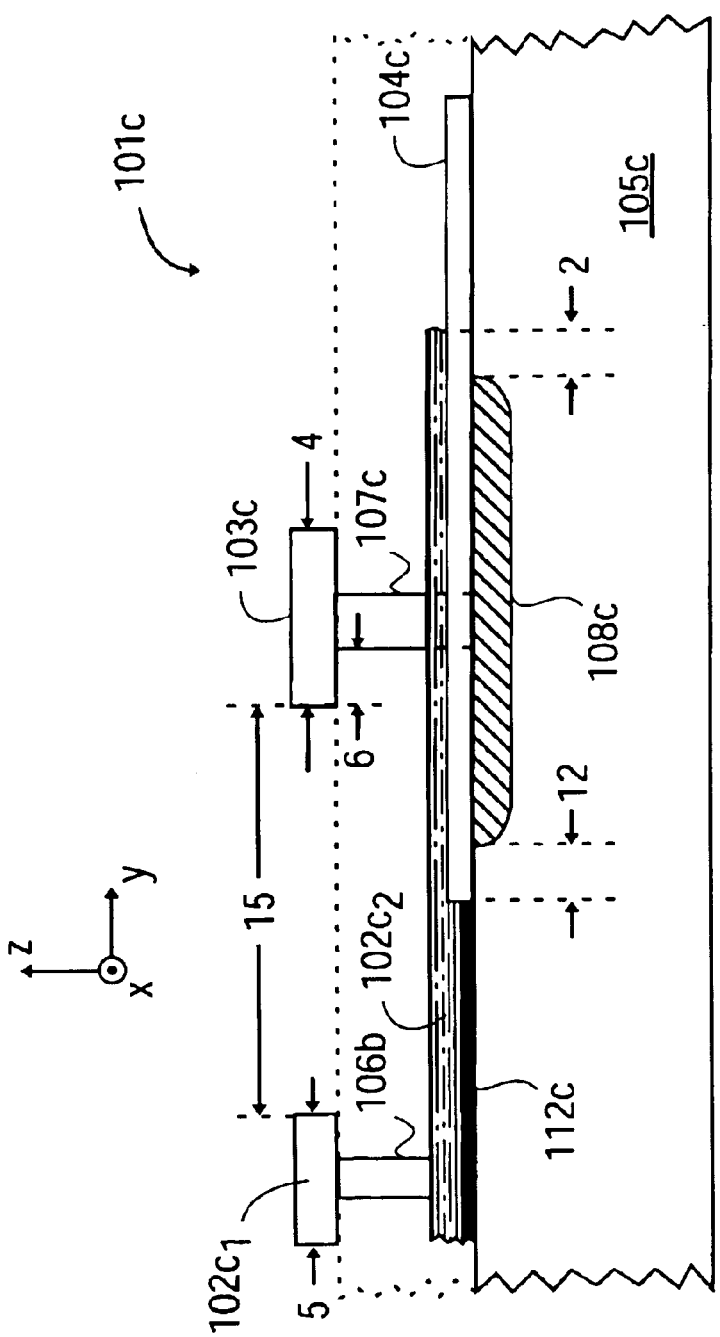
FIG. 1C is a side view of the exemplary layout of the transistor.

For example, referring to FIG. 1b, if a transistor is to support a large amount of current flow, the circuit designer may tailor the particular transistor to have a wider diffusion region 108*b* (along the y axis) and wider source and gate fingers 104*b*1, 104*b*2, 102*b*2*a*, 102*b*2*b* (along the y axis). This may or may not involve increasing: 1) the width 4 of the drain wiring 103*b* so that more than one drain contact (e.g., on either side of drain contact 107*b* along the y axis) is inserted between the drain wiring 103*b* and diffusion region 108*b*; 2) the width 11 of the source fingers 104*b*1, 104*b*2; and/or 3) the width 3 of the source wiring 104*b*.

Generally, as the amount of current that can flow through a particular structure (such as the drain wiring 103*b* and/or source fingers 104*b*1, 104*b*2 and source wiring 104*b*) increases, the widths of these features are expanded in order to accommodate the higher current flow. Here, if feature widths were not expanded as described just above, too much current flow through too narrow a feature would cause large amounts of heat dissipation during circuit operation. The heat dissipation, if sustained, could eventually cause the wiring or finger to "fail" (e.g., break open like a fuse) thereby causing the circuit to fail as well.

It is therefore evident where the "interplay" between the designer's wishes and the constraints mandated by the foundry design rules come into play. For example, continuing with the example provided just above, the foundry design rules may specify a maximum allowable diffusion width 17 and/or finger 104*b*1, 104*b*2, 102*b*2*a*, 102*b*2*b* width (e.g., width 16). As such, should the designer seek to design a transistor whose current flow is greater than that which these maximum dimensions would allow for, the designer may change the design or make the transistor "wider" by alternative means (such as designing a duplicate copy of transistor 101*b* next to transistor 101*b* along the x axis that uses the same source 104*b*, drain 103*b* and gate 102*b*1 wiring; which, in turn, effectively doubles the "width" of transistor 101*b* which allows the transistor to transport twice as much current).

The foundry design rules do not only come into play when a designer is tailoring transistor dimensions in light of particular current densities; but also, simply as a matter of fact when a particular semiconductor manufacturing process has been targeted (e.g., IBM 0.18 $\mu$m). Better said, because a particular manufacturer may employ a particular type of material, structure, technique and/or methodology (any or all of which could mandate a specific design rule), the designer is expected to ensure that his/her design is "clean" with respect to (i.e., meets) each and every design rule specified by the foundry. Typically, it is not uncommon for a design team to screen its entire design against the target foundry's entire design rule set before the manufacture of the design is attempted.

Foundry design rules are typically embodied as a listing of minimum and/or maximum (or ranges for) dimensions of or between one or more specific structural elements (e.g., fingers, wiring, etc.). A complete set of foundry design rules typically comprise 20 or more rules—but the number of rules is ultimately determined by the complexity of the process (in terms of specific structures that may be built) and the extent to which a particular foundry wants to specify rules for its process. Some typical foundry design rules have been illustrated in FIG. 1b.

In particular, these typical foundry design rules include: 1) the gate finger length 1 (usually expressed as a minimum allowable value); 2) the gate finger overlap of the diffusion region 2 (usually expressed as a minimum allowable value or a range); 3) the source wiring width 3 (usually expressed as a minimum allowable value or a range); 4) the drain wiring width 4 (usually expressed as a minimum allowable value or a range); 5) the gate wiring width 5 (usually expressed as a minimum allowable value or a range); 6) the contact to wiring edge distance 6 (usually expressed as a minimum allowable value); 7) the contact size 7 (usually expressed as a minimum value along the side of a contact); 8) the diffusion to gate structure distance 8 (usually expressed as minimum allowable value or range); 9) the contact to lower feature distance 9 (usually expressed as a minimum allowable value); 10) gate to source finger spacing 10 (usually expressed as a minimum distance); 11) source finger width 11 (usually expressed as a minimum allowable value or range); 12) the source finger overlap of the diffusion region 12 (usually expressed as a minimum allowable value or a range); 13) the gate finger spacing 13 (usually expressed as a minimum allowable value or range; 14) the gate finger tip to source wiring spacing 14 (usually expressed as a minimum distance or range); 15) "metal 1" wiring spacing 15 (usually expressed as a minimum distance—noting that wiring features are usually specified according to which level above the transistor that they reside upon); 16) the gate finger width 16 (usually expressed as a maximum allowable value or range); 17) the diffusion width 17 (usually expressed as a maximum allowable value or a range); and, 18) the diffusion length 18 (usually expressed as a maximum allowable value or a range). Other design rules may exist (e.g., design rules relating to oxide layer which have been obviated from FIG. 1b for simplicity).

2.0 Inefficiency of Layout Design

Traditionally, circuit layout has been performed according to a manually intensive, "custom crafting" approach wherein the particular features are manually drawn on a workstation and manually verified according to the applicable design rules on a feature-by-feature basis. With respect to digital circuits (wherein transistors are modulated as "on" or "off" in order to represent digital "1s" or "0s") the inefficiency of the layout process is not a major concern because logic gate designs (e.g., And gates, OR gates) enjoy frequent, pure reuse.

That is, in a sense, "the same" circuit is essentially repeatedly manufactured by a particular manufacturing process for each and every application that requires it. Here, because of the generic, standardized nature inherent with digital signaling (e.g., all purely digital circuits interpret 1s and 0s as inputs and provide is and 0s as outputs), digital circuits may be readily and easily combined with one another to form different digital circuit. As such, for example, a foundry could manufacture the same AND gate circuit (having the same layout) for a first customer's semiconductor chip (e.g., a microprocessor), a second customer's semiconductor chip (an application specific integrated circuit (ASIC)), a third customer's semiconductor chip (a graphics chip), etc.

Furthermore, as most all foundries pre-supply designers with digital libraries that include a vast collection of digital circuits (that have already been layed out); and, as digital circuits are capable of being described at an abstract level (e.g., in terms of AND gates and OR gates irrespective as to which foundry may be used to manufacture them)—digital circuit designs are easily "ported" from one manufacturing process to another (e.g., from foundry to foundry). Here, specialized compilers are able to convert an abstract (foundry-independent) description of the digital design into a specific, transistor level description that is workable with the "target" manufacturing process (with the libraries made available by the foundry) in terms of the applicable design rules.

By contrast, however, analog signaling is not generic or standardized to the extent that digital signaling is. Furthermore, basic analog circuits (e.g., amplifiers, active filters, voltage controlled oscillators, mixers, etc.) tend to be more specialized from circuit design to circuit design often requiring them to be "tweaked" or "optimized" to a particular environment or application. As such, unlike digital circuits, "the same" analog circuit is usually not repeatedly reused by a particular manufacturing process from application to application or customer to customer. For example, an available "first" design in an analog library of a particular manufacturing process may be for an amplifier having a bandwidth 100 MHz; yet, a particular "new" circuit design application targeted for the same process may call for an amplifier having 125 MHz of bandwidth.

Here, the slightest change made to the first design (e.g., to change its bandwidth from 100 MHz to 125 MHz) will necessitate the manual redrawing of the layout and rechecking against the design rules. Worst yet, if the target process for a particular design changes (e.g., an attempt is made to manufacture the 100 MHz on another foundry's process), an entirely new set of design rules will apply; causing, most-likely, an entire "re-design" of the circuit's layout in order to conform to the new set of design rules. As such, the ability to automatically perform automated (or at least semi-automated) circuit layouts at the transistor level should improve the inefficiencies associated with analog circuit design reuse; and/or porting analog designs from a first manufacturing process to a second manufacturing process.

3.0 Automated Circuit Structure Layout Methodology

Figure 2:
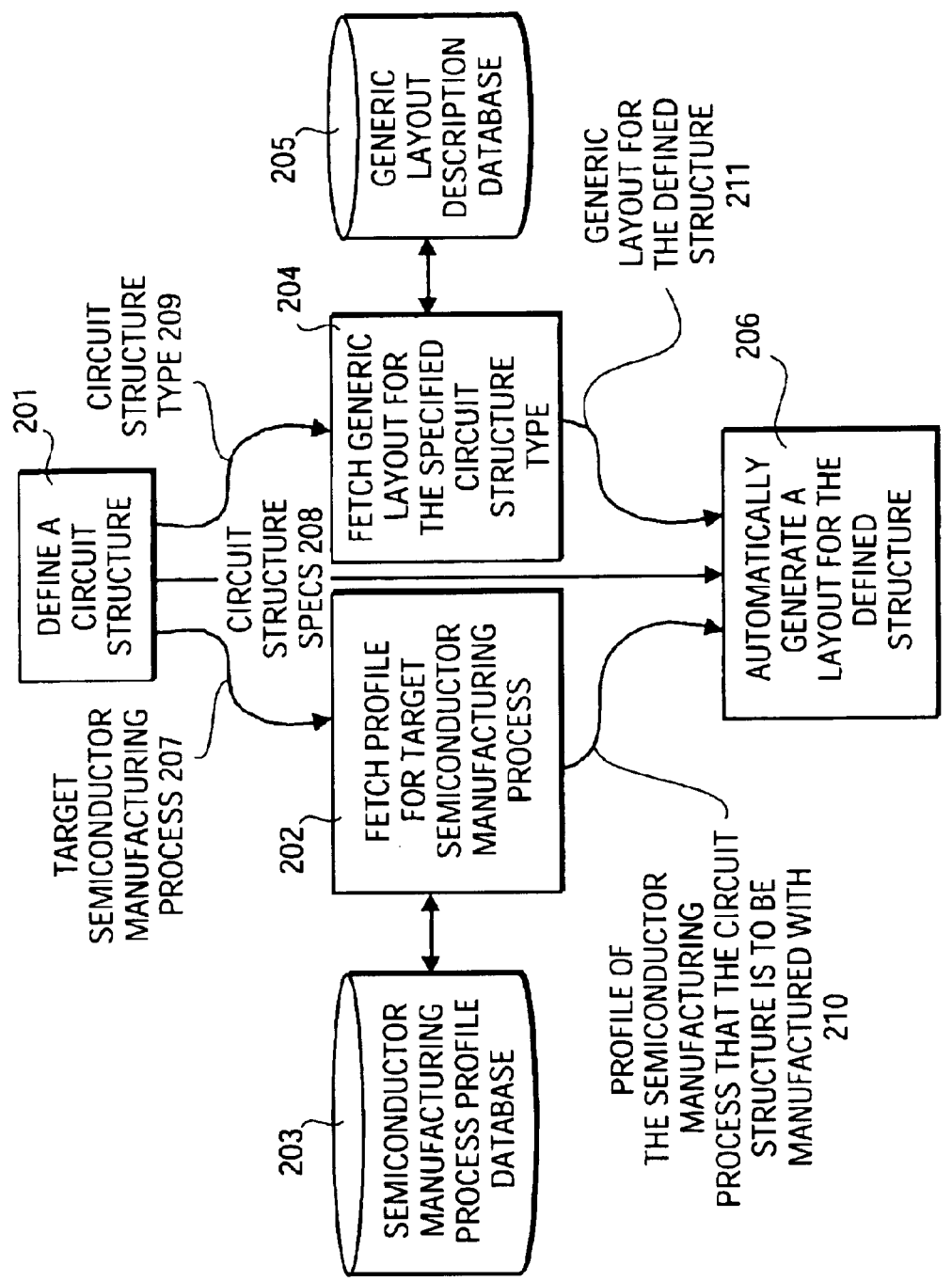
FIG. 2 illustrates a methodology for automatically laying out a circuit structure.

FIG. 2 shows an embodiment of a software methodology 200 that may be used to at least partially automate the layout of a circuit structure. As a result of employing the methodology 200 of FIG. 2, the tweaking of existing designs for the same process or the porting of existing designs to another process should be made easier as compared to traditional techniques. A circuit structure is a combination of one or more transistors that may be combined (or grouped with) other circuit structures in order to form a basic building block. A basic building block is a circuit design that can be represented as a functioning unit at a higher level of abstraction than the transistor level. For example, some examples of basic analog building blocks include (among a wealth of possible others): an amplifier, a mixer, a switched capacitor filter, a voltage controlled oscillator, a charge pump, a phase detector, etc.

Here, note that each of these analog building blocks are typically represented in commonplace circuit diagrams as entire functional units (i.e., having their own input(s) and output(s) and functional characteristics) rather than at a transistor level of detail. Circuit structures are "smaller" units of circuitry from which basic building blocks (such as any of the basic building blocks named above) themselves are constructed. Examples of various circuit structures include: a transistor, a diode, a capacitor, a differential pair, a differential load, and a current mirror (noting that cascaded, versions of each of these may also be viewed as circuit structures as well).

More discussion regarding each of these circuit structures is provided in more detail below in Section 7.0. However, before continuing with a more in-depth discussion of the methodology 200 of FIG. 2, note that a lower level layout (or "floorplan") may be realized by repeatedly executing the process observed in FIG. 2 for each circuit structure identified in a particular basic building block (and wherein, the various circuit structures are placed amongst each other (e.g., alongside in some cases) as appropriate in order to create a floorplan for the building block).

For example, if a design for an amplifier (the building block) is recognized as having a differential pair circuit structure, a differential load circuit structure and a current mirror circuit structure, the methodology of FIG. 2 may be executed three times in order to generate a layout for each of these circuit structures. The layout of these circuit structures may then be placed in accordance with some floorplan strategy (e.g., a slicing tree) so as to form a lower level layout of the amplifier itself. Again, more details regarding applications of the methodology of FIG. 2 are discussed in a later section.

Referring now to the methodology 200 of FIG. 2 note that a particular circuit structure is initially defined 201. According to the approach of FIG. 2, this definition can be broken down into three dimensions: 1) a first dimension 207 that identifies the particular manufacturing process that will be used to manufacture the circuit structure; 2) a second dimension 209 that specifies the type of circuit structure that is to be automatically layed out (e.g., a differential pair; a differential load; a current mirror; a transistor, a diode; a capacitor; cascaded versions of any of these, etc.); and 3) a third dimension 208 that effectively provides or relates to specific characteristics (e.g., speed and gain) of the transistors from which the circuit structure will be created.

In response to the first dimension 207, a profile 210 (e.g., akin to a data sheet) of the targeted manufacturing process is fetched 202. Here, the profile 210 corresponds to a listing of the design rules for the targeted manufacturing process wherein specific numeric values are provided for each enlisted design rule that are particular to the manufacturing process that the retrieved profile 210 represents (e.g., Foundry XYZ 0.18 μm process: 1) gate finger width= 0.18E-6 m; 2) gate finger overlap of the diffusion region= 0.22E-6 m; 3) source wiring width 0.24E-6 m; 4) drain wiring width=0.24E-6 m, etc.). In various embodiments, the profile 210 enlists the design rules for the process in a standardized format (e.g., in a particular sequence; and/or, with a standardized naming scheme).

Enlisting the design rules for a manufacturing process according to a standardized format allows different manufacturing processes to be characterized in a common way. As such, the design rules of any process can be "accounted for" with great ease and efficiency by a software methodology 200 that automatically generates a layout for a specified circuit structure. Better said, by designing the automatic layout engine software 206 to "look for" a particular design rule (e.g., "gate finger spacing") according to a particular name and/or a particular location within the profile 210, the design rules for different manufacturing processes (e.g., as represented with different profiles) simply become different input numbers that are used by the automatic layout methodology 206 to automatically calculate a clean layout.

As such, it is envisioned that a database 203 may exist (e.g., as implemented with typical archival data storage means such as one or more CD-ROMs in and/or magnetic storage devices (e.g., hard drive or tape drive)) that stores a different profile for each manufacturing process that a designer may wish to target one of his/her designs to. As such, the database 203 may include a different profile for each process amongst a plurality of processes that are comparable based on minimum feature size (e.g., an IBM 0.13 μm process profile, a TI 0.13 μm process profile, a TSMC 0.13 μm process profile, etc.) or are comparable based on a specific foundry (e.g., an IBM 0.13 μm "standard process" profile, an IBM 0.18 μm "embedded DRAM process" profile, an IBM 0.18 μm "Silicon-Insulator (SOI) process" profile, etc.).

The database may be constructed, for example, by having an engineer sift through the foundry design manual for each process to be profiled and recording the design rules found therein. Here, as a point of note, although semiconductor manufacturing processes tend to be "different" with respect to the numeric value that is articulated for a specific dimension (e.g., gate finger overlap of the diffusion region= 0.22E-6 for a first process; gate finger overlap of the diffusion region=0.28E-6 for a second process); nevertheless, extensive commonality or overlap exists with respect to the particular characteristics themselves. That, as just one example, although two different foundries may have a different dimension for the "gate finger overlap of the diffusion region"; nevertheless, note that both foundries have a design rule for the "gate finger overlap of the diffusion region". Here, after studying the foundry design rules of a plurality of popular manufacturers, it has been realized that at least 29 design rules are common to most all (if not all) processes; and, in one embodiment, each profile in the database 203 is therefore organized wherein these 29 rules are used to form a "basic" profile of the process. A depiction of this basic profile is presented in more detail below in Section 9.0 and referred to with respect to FIGS. 20 and 21. It is important to note that in alternative embodiments other rules may be added; and/or dropped (from those appearing in FIG. 21) according to engineering preference (s).

The methodology 200 of FIG. 2 also shows that, in response to the definition 209 of the type of circuit structure to be automatically layed out (e.g., differential pair), a generic layout description 211 of the particular circuit structure type is also fetched 204. Here, a different generic layout description may be constructed for each circuit structure that the methodology 200 is expected to generate a layout for; and, kept in the database 205. In various embodiments, the generic layout description 211, as described in more detail below, effectively describes the layout of a particular circuit structure type in broad terms that are independent of any specific design rule details.

Here, the generic description 211 and the profile 210 of the targeted semiconductor manufacturing process (along with the characteristic details 208 specific to the transistors of the circuit structure to be automatically layed out) are used by an automatic layout methodology 206, as appropriate, so that the layout of the circuit structure (as described by the generic layout description 211) is constructed in accordance with the particular constraints or specifics that are articulated in the manufacturing process profile 210 and the additional characteristics 208 that describe the transistors, from which the circuit structure is to be made.

Figure 4:
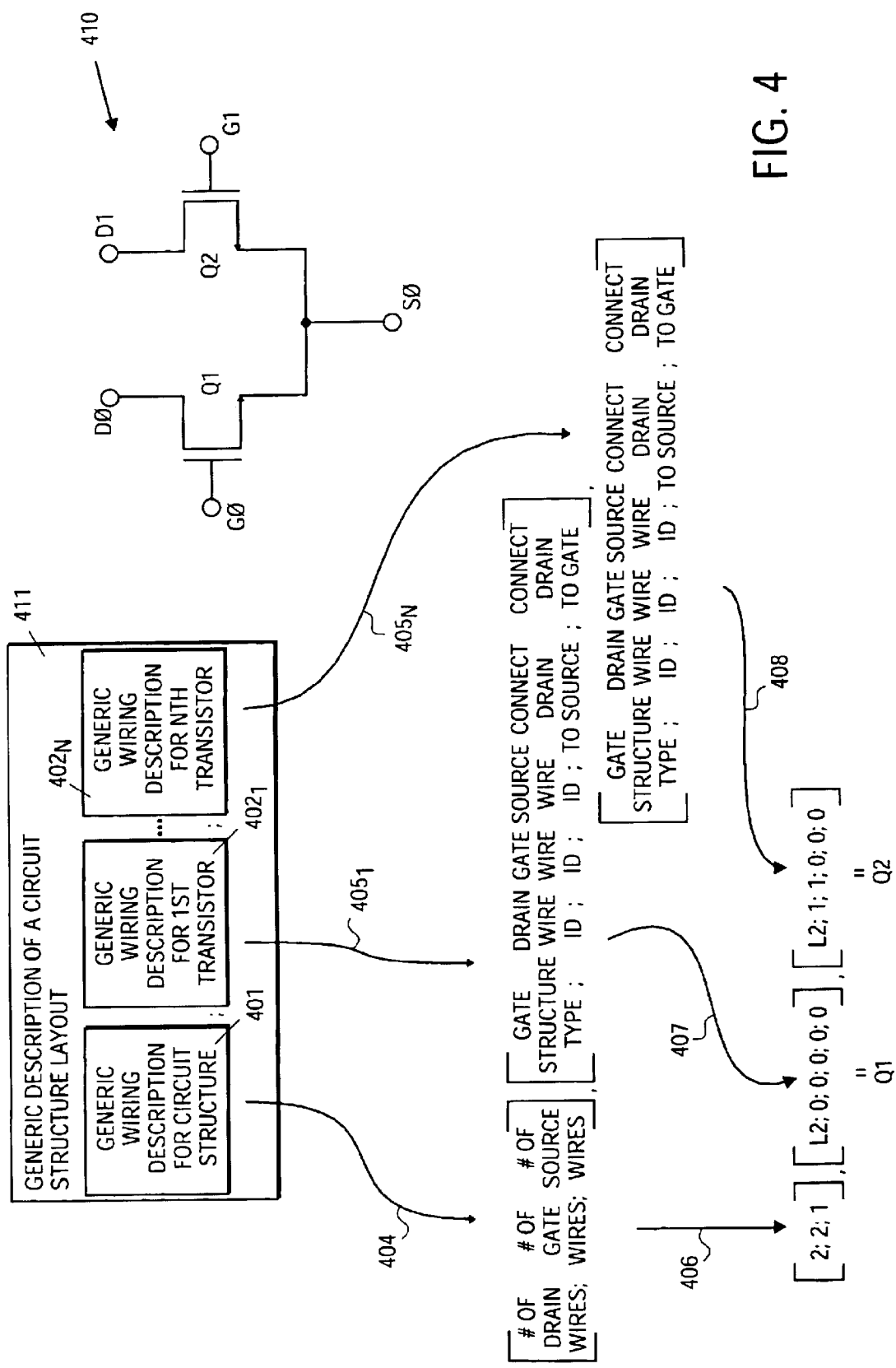
FIG. 4 illustrates an embodiment of a generic description for a layout for a circuit structure.

In the discussion that follows, FIG. 3 relates to an embodiment 308 of the specific details 208 that are articulated as being specific to the circuit structure'stransistors; FIGS. 4 and 8 relate to embodiments of various features of a generic layout description 211; and, FIGS. 5 through 7 (as well as FIGS. 9 and 10) relate to a more in depth discussion of the processes by which the automatic lay out methodology 206 of FIG. 2 may operate according to.

4.0 Circuit Structure Specifications

FIG. 3 embellishes on certain types of descriptions that may be used to implement the specifications of the circuit structure 208 that were referred to in FIG. 2. In particular, note that FIG. 3 regards the circuit structure specification 308 as some form of description $301_1$ through $301_N$ of the speed and gain/current characteristics of each of the N transistors that will be used to implement the circuit structure. As an example, a circuit structure referred to as a "differential pair" (an embodiment 310 of which appears toward the bottom of FIG. 3) will be used to illustrate such an approach.

Referring to the differential pair embodiment 310, note that a pair of transistors Q1, Q2 are employed. As such, N=2 according to the circuit specification model 308; and, a pair of transistor speed and gain/current characteristics $301_1$, $301_2$ are included in the specification 308. Accordingly, a specific embodiment as to how these characteristics may be expressed in also shown in FIG. 3. At a high level, each transistor may be viewed as being characterized, with a special syntax, in terms of its speed and its gain/current density requirements.

According to the syntax of FIG. 3, the speed of each of transistors Q1 and Q2 is characterized in terms of its gate finger length L (which corresponds to dimension 1 in FIG. 1b). The speed of a transistor typically helps to determine, among other possible characteristics, the speed (or bandwidth) of a basic building block that is constructed with the transistor. Thus, circuits built with shorter gate lengths tend to,exhibit higher bandwidth than circuits built with longer gate lengths.

The gain of each transistor is characterized in terms of: 1) its gate finger width W (which corresponds to dimension 16 in FIG. 1b); 2) the number of fingers F used to construct the gate (which is 2 as observed in FIG. 1b but can be increased to significantly higher numbers such as 20 or 30 or higher);

and 3) the aspect ratio ($m_x$ and $m_y$) that describes the manner in which multiple gate fingers are to be layed out. Here, $m_x$ corresponds to the number of gate fingers layed out along the x axis; and, $m_y$ corresponds to the number of rows of gate fingers layed out along the y axis. For example, if a gate is to be constructed with 60 gate fingers, the designer can specify (e.g., with $m_x$=10, $m_y$=6) that the 60 fingers are to be layed out with 6 rows of 10 gate fingers each. Note that F simply describes that which is described by $m_x$ and $m_y$; and, may therefore be removed from the syntax. In alternative embodiments, $m_x$ and $m_y$ (or other numeric representations of aspect ratio) may be automatically calculated (e.g., in response to a number of fingers F specification).

To explain this in more detail, recall from the discussion of Section 1.0 (Foundry Design Rules) that a designer can widen a transistor by duplicating a two fingered transistor and connecting their drain wires together, their source wires together and their gate wires together. The 60 fingered approach described above corresponds to an even wider transistor where, for example, "two fingered" transistors (one of which appears in FIG. 1b) are placed next to each other in groups of five to form a 10 fingered row along the x axis; and, six "copies" of these rows are placed above and/or below each other (along the y axis) as appropriate so to form a block of 60 fingers having a 5:6 aspect ratio.

The gate wires are then wired together, the source wires are then wired together, and the drain wires are then wired together so as to form a single 60-fingered transistor. Here, as the gain of transistor corresponds to the incremental amount of drain to source current that results in response to an incremental voltage placed on the gate node, note that a 60-fingered transistor should have approximately 30 times the gain of a simple 2 fingered transistor as observed in FIG. 1b (because, whereas the transistor 101b of FIG. 1b has two electron paths, a 60 fingered transistor would have sixty electron paths). The gain of a transistor is a characteristic that helps determine, among other possible characteristics, the amplification of a building block that uses the transistor. Thus, as a simple example, a building block that uses 60 fingered transistors should exhibit greater amplification than a building block built with a 2 fingered transistor.

The description of FIG. 3 also shows that each transistor is characterized in terms of the current density (e.g., maximum or nominal) that it is expected to handle. Current density is a figure that relates to "how much" current a transistor is expected to handle. Thus, continuing with the 60 fingered vs. 2 fingered transistor comparison provided just above, the source wiring of the 60 fingered transistor might be expected to handle 60 times the current that the 2 fingered transistor is expected to handle. Thus, often, some form of correlation exists between the current densities of a transistor and the gain of a transistor. Note, however, that this is not necessarily a truism because, frequently, high transistor gain is used for reasons other than large current flow. As such, the 60 fingered transistor may be expected to handle a maximum current density that is much less than 60 times that of the 2 fingered transistor. The amount of current density that a transistor is expected to handle depends upon the configuration of the building C block design that it is a constituent part of; and, as a result, its separate specification is included in each transistor description $301_1$ through $301_N$ according to the embodiment of FIG. 3.

Note that, the transistor characteristics $301_1$ $301_2$ (as well as the circuit structure specification 308 itself) may be expressed so as to follow the form of a special syntax. That is, a description of Q2 follows a description of Q1 in the syntax; and, for each transistor description, the gate width W follows the gate length L, the number of gate fingers F follows the gate width W, etc. Configuring the specifications to follow a special syntax allows the automatic layout software to easily use descriptions of "different" transistors (similar to the semiconductor manufacturing process profiles) so as to efficiently form different circuit structure layouts. Note also that in many instances (as is usually the case with a differential pair 310 circuit structure), the transistors are designed to be the "same". As such, the descriptions of Q1 and Q2 may contain an identical parameter set. In the particular syntax embodiment of FIG. 3, note also that each transistor is characterized in terms of whether or not a "dummy elements" is to be utilized or not in the construction of the transistor. A discussion of dummy elements is provided in more detail below with respect to FIG. 8B.

5.0 Generic Layout Description of a Circuit Structure

FIG. 3 related to an embodiment of an approach for characterizing the transistors that "make up" a circuit structure (e.g., which corresponds to a dimension 208 of the manner in which the circuit structure is defined 201 according to the methodology of FIG. 2). FIG. 4, by contrast, relates to an embodiment by which a generic layout description 211 may be formulated so that, at a high level, a description of the appropriate layout can be realized in response to a definition of the type of circuit structure 209 that is to be constructed. Then, as described with respect to FIG. 2, the high level layout description 211 is used as guidance (along with the transistor characterizations 208 and manufacturing process profile 210) to automatically construct a description of the circuit structure that was previously defined 201.

According to the embodiment of FIG. 4, a generic layout description for a circuit structure includes a generic wiring description 401 of the overall circuit structure; and, a description $402_1$ through $402_N$ as to how each transistor within the circuit structure "connects to" the generic wiring description. Specifically, again using the example of a differential pair 410 as an example, note that the differential pair has: 1) two separate drain nodes D0, D1; 2) two separate gate nodes G0, G1; and, 3) one common source node S0. This, by itself, is a description that is unique to a differential pair; and, as such, is effectively captured by the generic wiring description 401.

An embodiment of a syntax 404 for the generic wiring description 401 is observed in FIG. 4 along with an embodiment 406 as to how the generic wiring description of a the differential pair 410 could be described according to this syntax 404. Here, the embodiment 406 indicates the number of separate drain nodes ("2"), the number of separate gate nodes ("2") and the number of separate source nodes ("1"). That is, the syntax "2;2;1" describes at a high level the wiring of a differential pair because (as is evident from the differential pair topology 410) a pair of drain wires will be needed; a pair of gate wires will be needed; and, a single source wire will be needed.

The transistor descriptions $402_1$ through $402_N$ effectively describe which transistor is connected to which wire; and, whether or not the drain of a particular transistor is connected to its own source or gate. Better said, implicit in the embodiment 406 of the generic wiring description 401 is the fact that there are two drain wires (e.g., film drain wire 0 and drain wire 1), two gate wires (gate wire 0 and gate wire 1) and a single source wire (source wire 0). Thus, the embodiments 407, 408 of the transistor layout descriptions 402$_1$, 402$_2$ indicate that transistor Q1 has: 1) its drain node connected to drain wire 0; 2) its gate node connected to gate wire 0; and, 3) its source node connected to source wire 0; and that transistor Q1 has: 1) its drain node connected to drain wire 1; 2) its gate node connected to gate wire 1; and, 3) its source node connected to source wire 0.

Furthermore, indication is provided (for each of transistors Q1 and Q2) whether or not the drain is connected to the source or gate of the same transistor. As seen in depiction 410, neither of transistors Q1 or Q2 has its drain connected to its source or gate. As such, the "connect_drain_to_source" flag and the "connect_drain_to_State" flag is set to "0" for each of transistors Q1 and Q2. Possible effects of setting either of these flags to "1" are described in more detail below in Section 7.0.

A more detailed discussion of a layout for a differential pair is provided further below (with respect to FIG. 7a) so that the reader will be able to better appreciate its appearance. Furthermore, note that the description 407, 408 of each transistor also includes a definition of a specific type gate structure ("L2"). An embodiment of an L2 gate structure is provided in FIG. 8 and discussed in more detail below. However, note that reference to a particular type of gate structure within the transistor layout descriptions 407, 408 entertains the possibility that different gate structures (e.g., the L2 structure, something other than the L2 structure, etc.) could be used/specified on a transistor by transistor basis.

6.0 Automatic Layout Methodology

Figure 5:
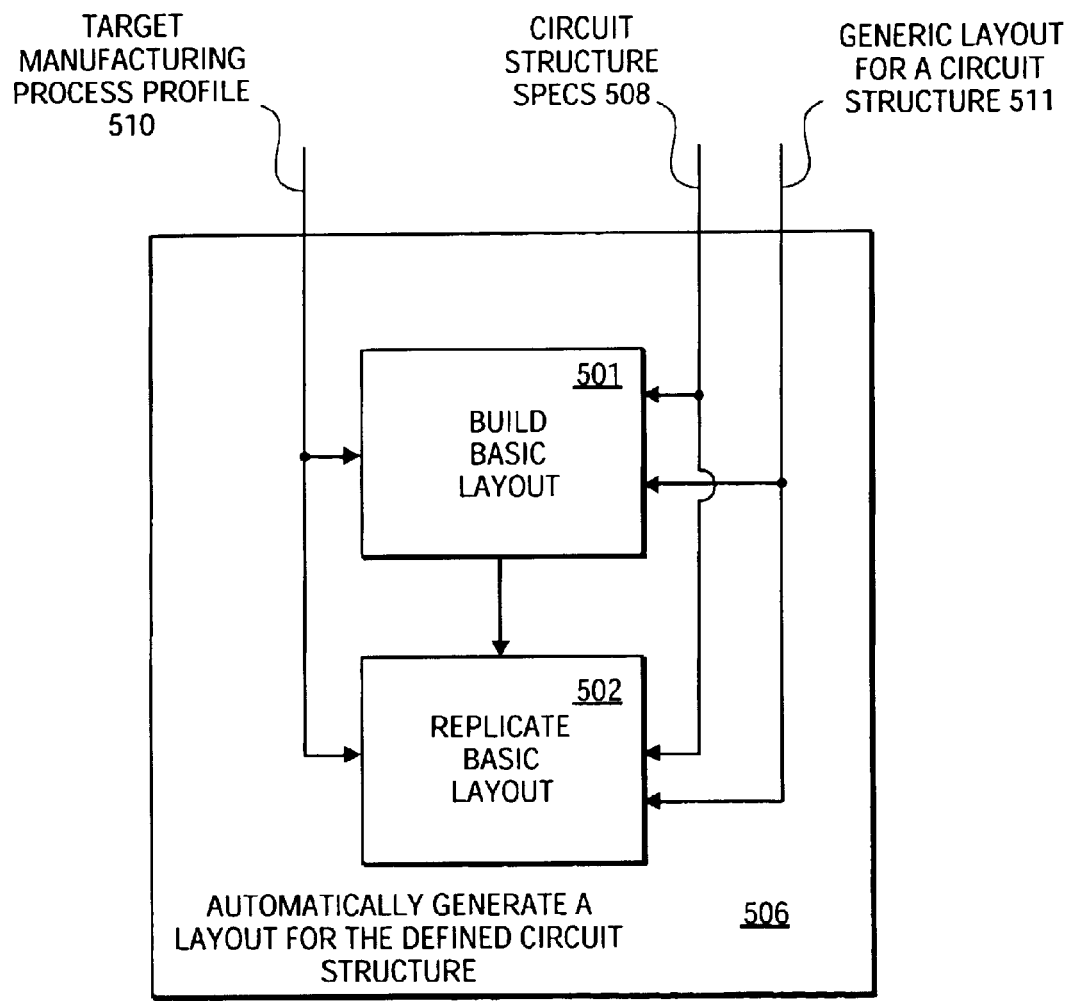
FIG. 5 illustrates an embodiment of a methodology that may be used to automatically generate a layout for a circuit structure by utilizing a target manufacturing process profile, a circuit structure specification and a generic description of a layout for a circuit structure.

Referring briefly back to FIG. 2, embodiments of each of the inputs 208, 210, 211 to the automatic layout process 206 have been described. As such, the present section relates to various embodiments as to how these inputs could be used to automatically construct a layout in response to these inputs. FIG. 5 shows, at a high level, an embodiment of a software methodology 506 that may be used to implement the automatic layout methodology 206 of FIG. 2. Here, note that the methodology 506 of FIG. 5 is organized according to a first sequence 501 in which a basic layout is constructed 501; and, a second sequence 502 in which the basic layout is replicated 502 (so as to form multiple fingered transistors with one or more rows of the replicated basic layout).

Here, note that foundry design rule details from the profile 210, 510 of the targeted manufacturing process and the specification 208, 508 of the circuit structure's transistors are used as appropriate in order to form a layout that conforms to each of these sets of requirements. The generic description of the circuit structure layout 211, 511 is used to generate 501 the basic layout. The basic layout, in turn, corresponds to a basic layout for each transistor associated with the circuit structure being developed (e.g., Q1 and Q2 for differential pair 310, 410 observed in FIGS. 3 and 4). If more fingers are needed to effectively increase the gain of the transistors in the basic layout (e.g., as specified by the $m_x$ dimension in the circuit structure specification 308), the basic layout is correspondingly replicated to form a row of interleaved transistors. If multiple rows are needed to further increase the gain of the transistors (e.g., if an $m_y$ dimension is provided), then the rows are replicated themselves.

6.1 Basic Layout Construction

Figure 6:
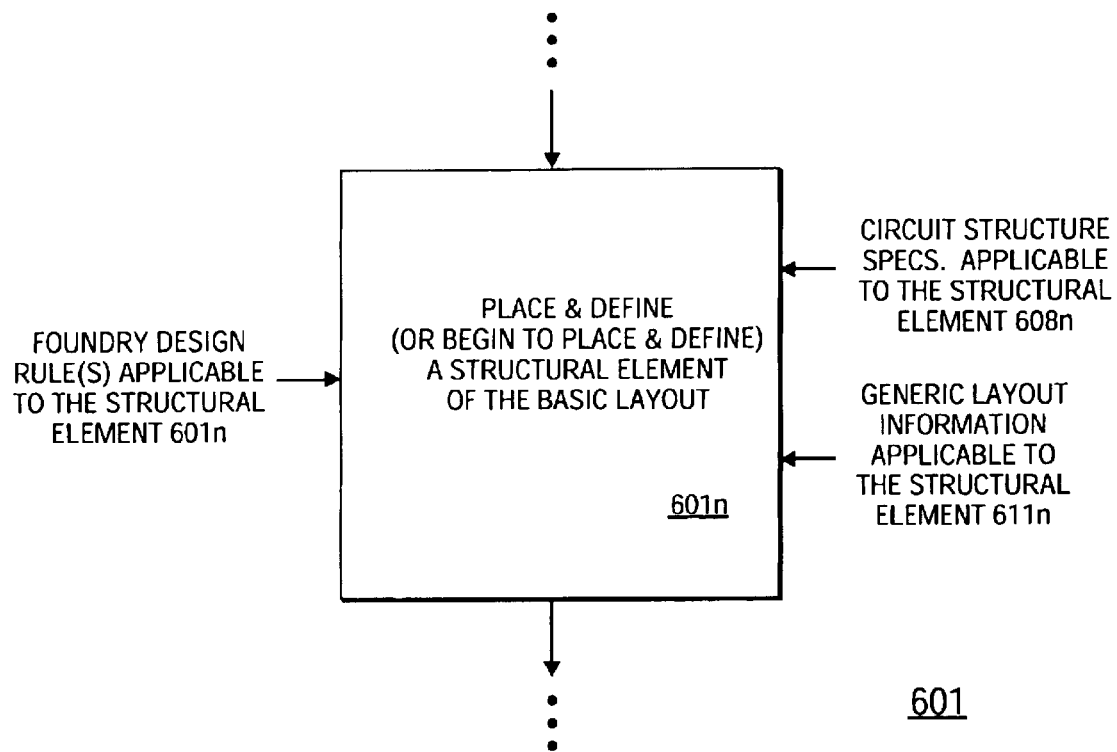
FIG. 6 illustrates an embodiment of a methodology that may be used as a component of the methodology of FIG. 5.

FIG. 6 shows an embodiment of a fundamental unit of operation by which the basic layout of a circuit structure may be automatically developed. As such, methodology 601n of FIG. 6 corresponds to, in various embodiments, a component of methodology 501 of FIG. 5 that can be continually re-applied (e.g., with at least one execution per structural element) until the basic layout is formed. Here, the methodology 601n of FIG. 6 effectively places and defines (or at least begins to place and define) a particular structural element that the circuit structure is comprised of. Here, a structural element may be a diffusion region, a wire, a finger, a contact, a via or a landing area for a via; and, placement refers positioning whereas defining refers to the setting of one or more dimensions.

For each execution of methodology 601n of FIG. 6, in order to form a workable layout, the foundry design rules 610n applicable to the particular structural element being formed are taken into account (e.g., minimum wiring width if the source wiring corresponds to the structural element); and, the circuit structure specification information 608n applicable to the particular structural element being formed is also taken into account (e.g., the source current density if the source wiring corresponds to the structural element). Similarly, information from the generic layout description 611n may also be taken into account (e.g., by configuring the placement of the source wiring and by configuring the source wiring for both Q1 and Q2 as the same wire if the generic layout description corresponds to a differential pair).

Figure 7A:
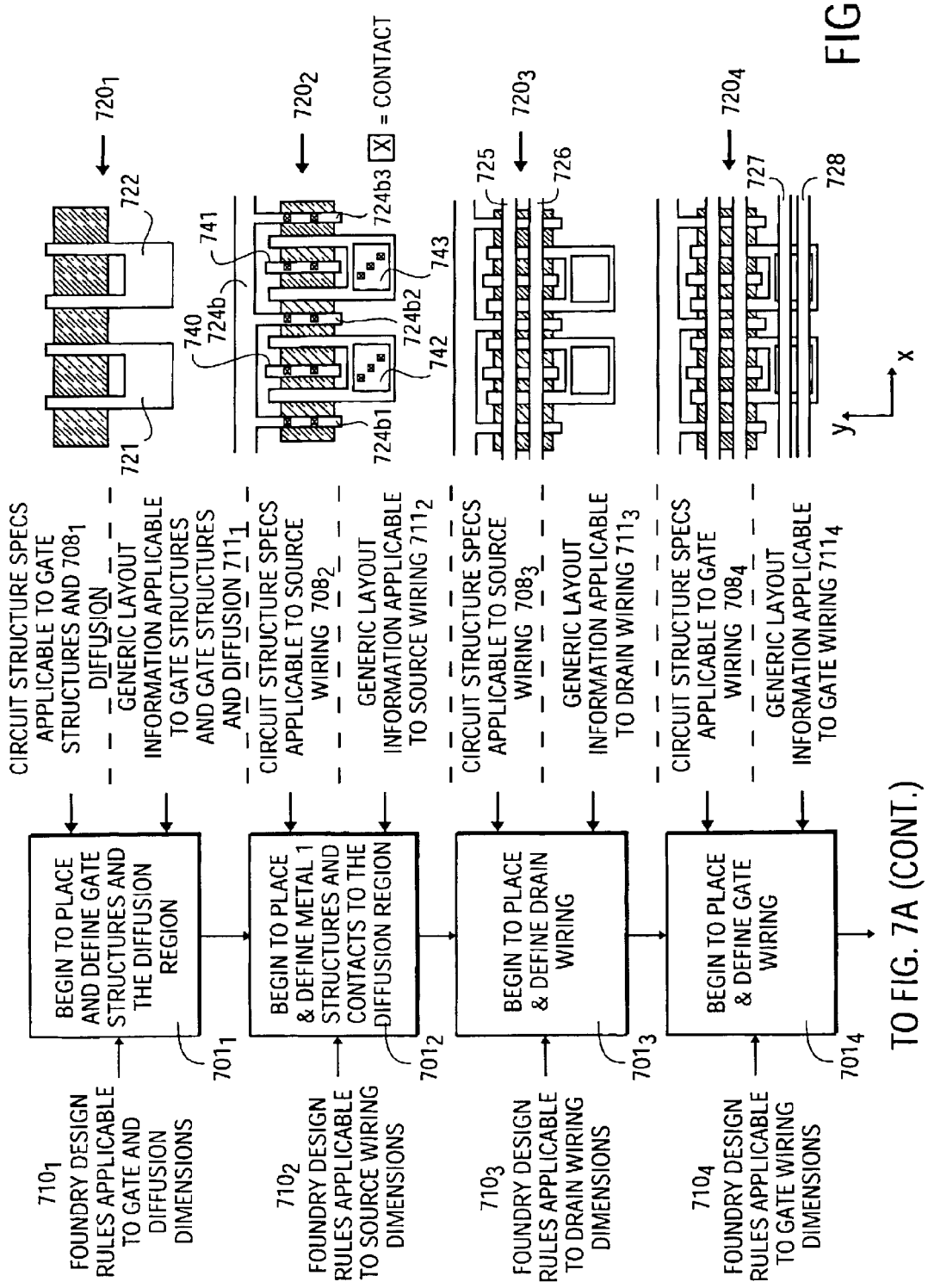
FIG. 7A illustrates a depiction of the methodology of FIG. 6 being consecutively re-applied so as to form a basic layout for a circuit structure.
Figure 7A:
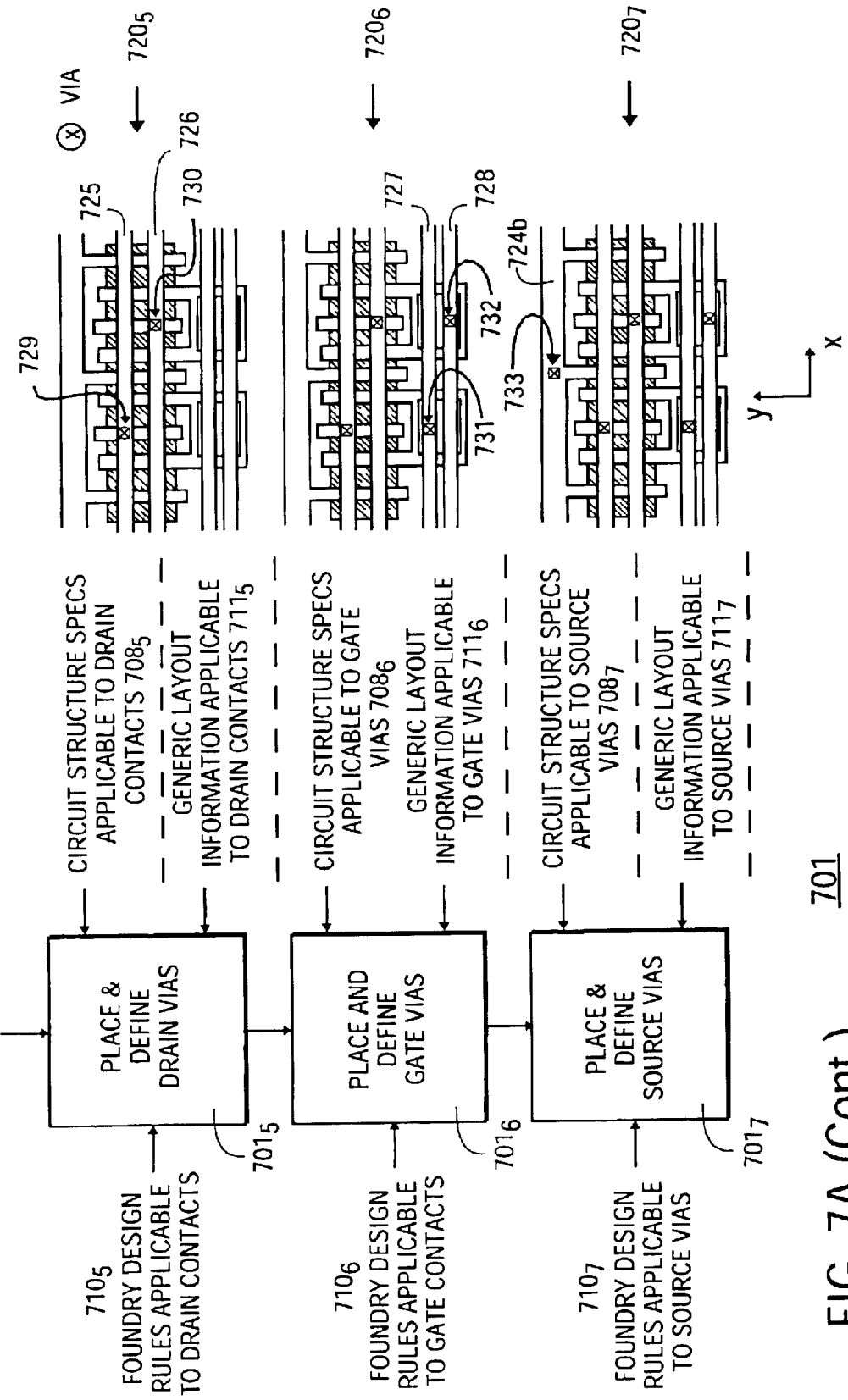
Figure 8A:
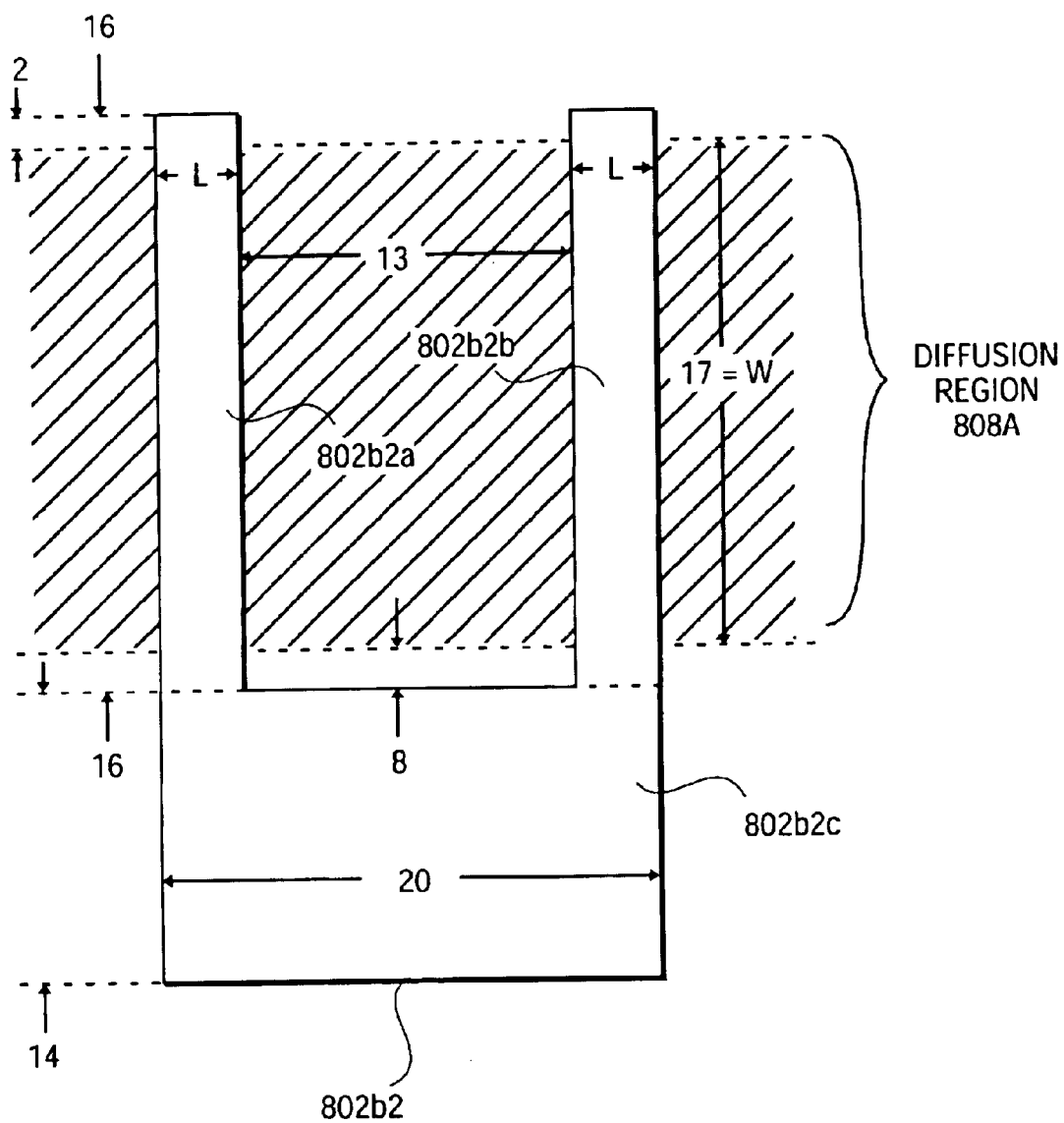
FIG. 8A illustrates a generic gate structure that may be called upon for more than one type of circuit structure.

FIG. 7A provides, as an example, an embodiment by which the methodology 601n of FIG. 6 can be re-applied for each structural element of a basic layout. Note that a basic layout may be made to include a standard collection of structural elements (regardless of which circuit structure is to be automatically laid out). For example, according to at least one embodiment (to which the reader is referred ahead to FIGS. 8b and 8c —noting that FIG. 8c is drawn approximately from the perspective of arrow 890 of FIG. 8b), the standard basic layout includes: 1) at least one gate structure 852 and a diffusion region 858; 2) at least one source wire 864; 3) at least a pair of source fingers 864a, 864b; 4) at least one contact (e.g., contact 856) between each source finger and the diffusion region; 5) at least one drain contact wire 865; 6) at least one contact 857 between the drain contact wire 865 and the diffusion region 858; 7) a gate pad layer 863; 8) at least one via 859 between the gate pad layer 863 and the gate structure 852; 9) at least one drain wire 854; 8) at least one gate wire 862; 10) at least one drain wire 854 to drain contact wire 865 via 855; and 11) at least one gate wire; 862 to gate pad layer 863 via 861. As such, according to embodiments conforming to this approach, any circuit structure type would be constructed so as to include at least the above structural elements.

Furthermore, basic layouts may be designed according to a standard wiring scheme (or layout strategy) regardless as to which circuit structure is being automatically developed. As a result, most basic layouts (independent of circuit structure type) are formed with source, drain and gate wires being placed in approximately the same relative location. For example, according to one embodiment (to which FIGS. 8b and 8c may again be referred to), the following wiring scheme is employed: 1) source wiring 864 is run at the metal 1 layer and along the x axis near the diffusion region; 2) source fingers (e.g., source finger 864b) are run along the y axis at the metal 1 layer above the diffusion region outside the gate fingers 852a, 852b(which run over the diffusion region along the y axis) of the gate structure 852; 3) the drain contact wire 865 is run at the metal 1 layer along the y axis above the diffusion region and between the pair of gate fingers 852a, 852b; 4) the gate pad layer 863 if formed at the metal 1 layer above a wide region of the gate structure 852 (referred to as the gate structure's landing area); 5) drain wiring 853, 854 is run along the metal 2 layer above the diffusion region along the x axis; and 6) gate wiring 862, 866 is run along the metal 2 layer above the gate pad layer 863. Note that alternative wiring scheme embodiments are possible (e.g., as just one example, wherein the source wiring runs over the diffusion region and the drain wiring runs alongside the diffusion region)

The depictions $720_1$ through $720_7$ of FIG. 7A demonstrate a scheme for automatically laying out a basic circuit structure layout where (as observed in FIGS. 8b and 8c) the drain wiring runs over the diffusion region. The methodology 701 of FIG. 7A elaborates on how the basic layout and wiring strategy elaborated on above can be applied to a differential pair (e.g., recalling that a differential pair 310, 410 was first shown in FIGS. 3 and 4) so as to develop its basic layout (in conjunction with the continued reapplication of the methodology 601n of FIG. 6). According to the approach of FIG. 7A, the gate structure(s) and diffusion region of the basic layout of the differential pair are initially placed; and, their dimensions begin to be defined $701_1$.

Depiction $720_1$ illustrates the extent to which the layout has begun to be placed once methodology $701_1$ is completed. The dimensions also begin to be defined. Here, the phrase "begin" to be placed and defined is chosen because, as will be made apparent further below, the addition of later structural (e.g., drain contacts, drain wires, etc.) may "tweak" or alter an initial set of placements and/or dimensions. For example, the start of the drain wiring definition (at methodology $701_3$) may alter the width of the diffusion region (as it was initially set at the conclusion of methodology $701_1$).

Recall from the discussion of FIG. 4 that a particular gate structure "12" was called out by the generic layout description embodiment 407, 408 for each of transistors Q1 and Q2. A depiction of an L2 gate structure 802b2 is observed in FIG. 8a. According to the L2 gate structure embodiment 802b2 of FIG. 8a, the gate structure comprises a pair of fingers 802b2a, 802b2b and a wide block or "landing area" region 802b2c. Here, the "landing area" region serves as a region where one or more vias from a metal 1 gate pad layer can be connected to.

The L2 gate structure, as explained in more detail below within Section 7.0, can be used to construct a wide range of circuit structures such as (besides a differential pair): a differential load, a diode, a capacitor, a transistor and a current mirror (as well as cascaded versions of each of these). Once the L2 structure has been called out by the generic layout description of a particular transistor (e.g., both Q1 and Q2 as observed in the differential pair 310, 410 of FIGS. 3 and 4), the gate finger spacing 13 (referring to FIG. 8a) may be set at the minimum allowable value as allowed by the applicable foundry design rule set. Thus, input $702_1$ of FIG. 7A may at least provide the gate finger spacing of the applicable manufacturing process profile. Similarly, as the gate length L and gate width W are specified by the circuit structure characteristics 708 (e.g., as observed with respect to the L and W terms associated with the transistor speed and gain characteristics in FIG. 3), input 708 may be viewed as corresponding to providing at least these requirements.

Note that, in the embodiment being presently described, the length 20 of the L2 structure landing area 802b2c can be set to be coextensive with 2L plus the gate finger spacing 13. Furthermore, note that the gate width W is coextensive with the width 17 of the diffusion region 808. As such, methodology $701_1$ of FIG. 7A also at least begins to establish the diffusion region dimensions as well. Here, once the gate width W 17 is understood from the circuit structure specification information $711_1$, the gate finger width 16 may be established by tailoring it to be compliant with the applicable foundry design rules that specify: 1) the gate finger overlap of the diffusion region 2; and, 2) the diffusion to gate structure distance 8. Again, these dimensions may be found in the manufacturing process profile; and, as such, are associated with input $710_1$.

The length of the diffusion region (e.g., dimension 18 as seen in FIG. 1b) may begin to be established once the source fingers are placed (as described in more detail below); and, similarly, the width 19 of the gate structure landing area 802b2c may be begin to be established once the widths of the gate wires over the landing area 802b2c are determined. Lastly, at least with respect to the above described dimensions, note that the generic layout description for a differential pair (an embodiment of which was discussed in FIG. 4) calls out a pair of L2 structures (one for each of transistors Q1 and Q2). As such, the setting of the length and width dimensions of the gate fingers as described just above can be performed upon a pair of L2 data structure descriptions. Hence, a pair of L2 structures 721, 722 are observed in illustration $720_1$ of FIG. 7.

Figure 7B:
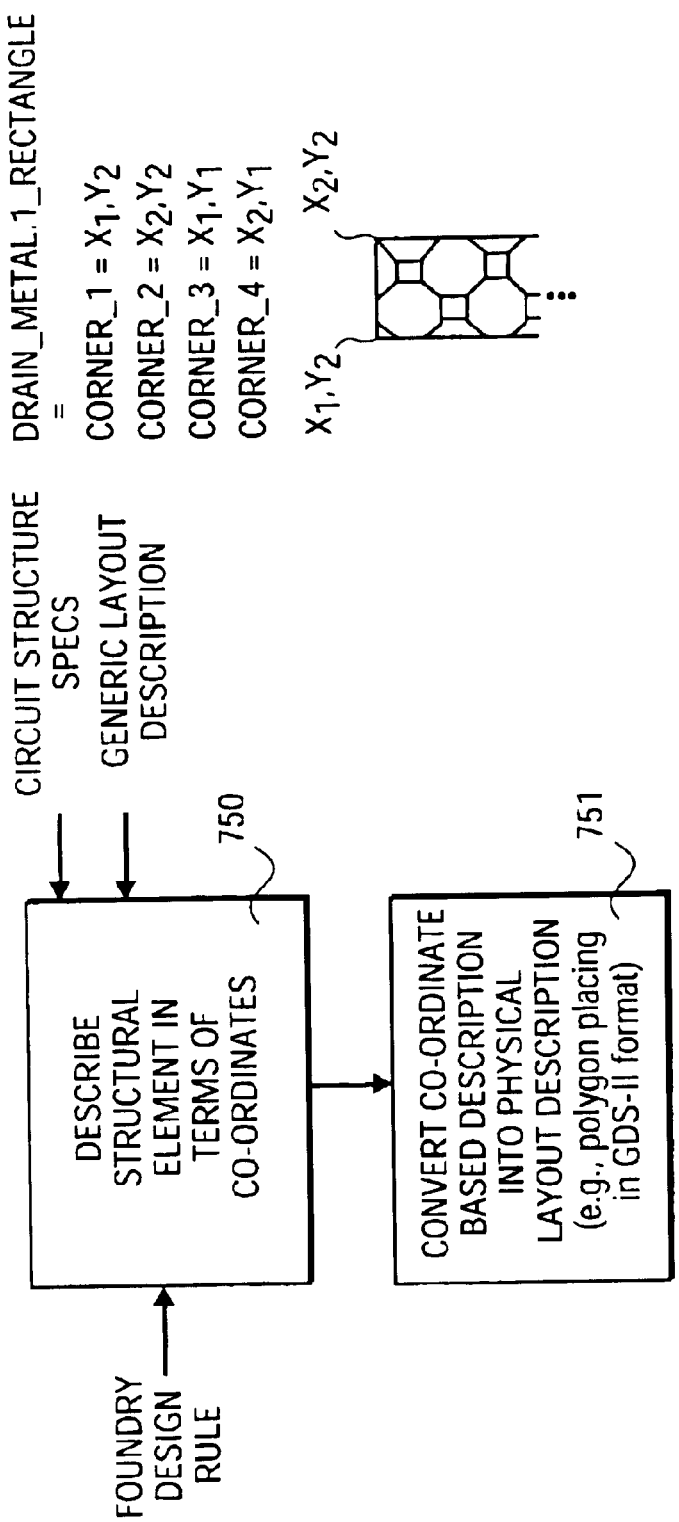
FIG. 7B illustrates an embodiment of a methodology that may be used to construct information for a physical layout file.

A description of the L2 gate structure may be stored as part of database 205 (or as part of another database where gate structures are stored). In an embodiment, the description (as well as the description of other structural features or elements such as the wiring, fingers, contacts, etc.) is expressed in terms of a coordinate system (e.g., an x,y coordinate system). FIG. 7B elaborates on such an approach in more detail. According to the depiction of FIG. 7B, the description of one or more of the layout's structural elements in terms of a coordinate system (e.g., a rectangle for the drain contact wire 865 of FIG. 8b) allows the description to be described in terms of specific lines or other mathematical expressions.

These, in turn, may be efficiently yet accurately described in a widely used computer programming language (e.g., C++) that can be compiled for any operating system (e.g., windows, UNIX, etc.). According to the methodology of FIG. 7B, the mathematical description may then be converted 751, in software, into a physical layout description format that, for example, can be used to generate one or more masks for the semiconductor chip that the circuit element is to be manufactured with. An example of a physical layout description format is GDS-II; which describes structural elements as polygons or other geometric shapes. Here, conversion 751 automatically converts the mathematical expression from methodology 750 into the particular arrangements of geometric shapes that correspond to the described feature.

Continuing with the methodology 701 of FIG. 7A, once the gate structures and diffusion region have begun to be placed and defined $701_1$, the metal 1 layer; and the contacts between the metal 1 layer and the diffusion and gate structure begin to be defined 7012. Depiction 7202 illustrates the extent to which the layout has begun to be placed once methodology 7012 is completed. Note that, in this embodiment, the metal 1 layer is used to form: 1) the source wiring 724b; 2) the source wiring fingers 724b1, 724b2, 724b3; 3) the drain contact wiring 740, 741; and, 4) the gate pad layer 742.

Here, note that source fingers 724b1, 724b2, 724b3 are automatically extended so as to exist on the outside of each of the gate structures 721, 722. Furthermore, as a common source node is specified by the generic layout description of FIG. 4, a single source finger 724b2 (rather than a pair of source fingers) is allowed to extend between the pair of L2 gate structures 721, 722. The software responsible for executing methodology $7012$ can refer to the generic layout description (as part of input $711_2$) in order to realize this approach is acceptable. The source finger width (as measured along the x axis) may be established for each source finger in light of the source current densities for both transistors and the fact that the source node is common to both transistors.

Here, the former feature is articulated in the circuit structure specification (and, as such would be regarded as a component of input $708_7$); and, the later feature is an artifact of the generic layout description (as mentioned just above). In the case of atypical differential pair embodiment, the software that executes methodology $701_2$ could., automatically determine a source finger width for the outer source fingers $724b1$, $724b3$ that is sufficient to carry 0.50 the source current density specified by the circuit structure specification $708_2$; and, a source finger width for the inner source finger $724b2$ that is sufficient to carry the source current density specified by the circuit structure specification $708_2$ (noting that they are usually specified as the same for both transistors Q1 and Q2).

This follows naturally when one considers that the middle source finger $724b2$ is configured to collect two electron flows while each outer source finger collects one electron flow; and, that a total of twice the specified current density will apply to the source wiring. Thus, the software may be designed to consider the current densities and current flows in the circuit structure when configuring wiring and/or finger widths. Consistent with this perspective, the width of source wiring $724b$ that runs along side of the diffusion (as depicted in illustration $710_2$) could also be configured.

The length (as measured along the y axis) of each source finger could also be determined once any applicable foundry design rules are considered (such as a diffusion to source wire $724b$ distance and/or a source finger overlap of diffusion distance). To the extent that any such foundry design rules apply, they would be considered as a part of input $710_1$. Finally, the number and position of the contacts between the source fingers $724b1$, $724b2$, $724b3$ and the diffusion region begin to be defined. Here, the number and positioning of the contacts per source finger should be sufficient to handle the expected current density per source finger and be in conformance with the applicable foundry design rules (e.g., minimum contact spacing, minimum contact width, etc.).

Once the placement of the middle source finger $704b2$ is established, the spacing of the gate structures $721$, $722$ relative to each other (along the x axis) can be more accurately defined (e.g., by reference to a source finger to gate finger spacing design rule); and, then, a placement for the outer source fingers $724b1$, $724b2$ can also be determined. Furthermore, the drain contact wires $740$, $741$ (and the contacts between the drain contact wires and the diffusion region) may begin to be placed and defined. Current density and foundry design rules may be considered similar to that described above with respect to the source fingers. Once a placement for the drain contact wires $740$, $741$ is articulated, the outer source fingers $724b1$ $724b2$ may be adjusted (e.g., along with the spacing of the gate fingers for a gate structure). At this point, a "first pass" length for the diffusion region (as measured along the x axis) can also be determined (e.g., in light of a minimum source finger to diffusion edge distance foundry design rule). Finally, the placement and dimensions of the gate pad layers $742$, $743$ may begin to be defined along with the vias that connect the gate pad layers $742$, $743$ to their corresponding gate structure $721$, $722$.

Once the layout is placed as observed in depiction $720_2$ (i.e., after the metal 1 layer has begun to be placed and defined $701_2$), the drain wiring begins to be placed and defined $701_3$. From the generic layout description (as observed in FIG. 4), it is apparent that a pair of drain wires exist in the basic layout for a differential pair. Using this information (which corresponds to input $711_3$), a pair of drain wires $725$, $726$ are placed over the diffusion region. The spacing between the drain wires may be tailored to be compliant with the applicable foundry design rule for metal 1 wire spacing (which would correspond to input $710_3$).

Furthermore, the widths of the drain wires $725$, $726$ (as measured along the y axis) can be tailored to be wide enough to handle the current density specified for either of the transistors. As this information originates from the circuit structure specification (e.g., as observed in FIG. 3), this information may be regarded as associated with input $708_3$. Here, note that the combined widths of the drain wires $725$, $726$ and their spacing along the y axis should be less than the width of the diffusion region W. If this condition is not met, the software can report to the designer that his/her design is not feasible.

Once the layout is placed as observed in depiction $720_3$ (i.e., after the drain wiring is determined $701_3$), the gate wiring begins to be placed and defined $701_4$. From the generic layout description (as observed in FIG. 4), it is apparent that a pair of gate wires exist in the differential pair layout. Using this information (which corresponds to input $711_3$), a pair of gate wires $727$, $728$ are placed over the gate pad layers $742$, $743$. Here the spacing between the gate wires $727$, $728$ may be tailored to be compliant with the applicable foundry design rule for metal 1 wire spacing (which would correspond to input $710_4$).

Furthermore, the widths of the gate wires $727$, $728$ (as measured along the y axis) can be tailored to be a nominal or minimum width as gate wires usually do not carry a significant amount of current (or, alternatively, the circuit structure specification can be made to include a gate node current density). Here, note that the combined widths of the gate wires $727$, $728$ and their spacing along the y axis should be less than the width of the gate landing areas. Again, if this condition is not met, the software can report to the designer that his/her design is not feasible.

Once the layout is established as observed in depiction $710_4$ (i.e., after the gate wiring has begun to be placed and defined $701_4$), the vias between the drain wiring and the drain contact wires begin to be placed and defined $701_5$. From the generic layout description (as observed in FIG. 4), it is apparent that transistor Q1 is connected to drain wire 0 and transistor Q2 is connected to drain wire 1. Using this information (which corresponds to input $711_3$), a first $725$ of the pair of drain wires is identified as wire 0 and a second $726$ of the pair of wires is identified as wire 1. As such, a first via $729$ is configured to connect drain wire $725$ to drain contact wire $740$ (which corresponds to the drain of transistor Q1); and, a second via $730$ is configured to connect drain wire $726$ to drain contact wire $741$ (which corresponds to the drain of transistor Q2). Here, each via should connect its respective drain wire to its respective drain contact wire in a manner that is compliant with the applicable foundry design rules (e.g., via to wiring edge distance, via size, etc.).

These design rules may be regarded as part of input $720_5$. Also, the current density of the drain (e.g., as specified via the circuit structure description of FIG. 3), which may be regarded as a part of input $708_5$, should not be such that the maximum current density of the vias (as specified by the foundry design rules) is exceeded. If it is, the software may be configured to automatically attempt to add another via for connecting drain wire $725$ to drain contact wire $740$ (e.g., along the y axis above or below the original via 729). Here, the width of the drain wire 729 (as measured along the y axis) may need to be increased in order to accommodate the additional via. As such, some further placement and/or defining of the drain wires 725, 726 may occur as a result of the placement of these vias.

Adding an additional via will cut the current density of the original contact 729 in half because the total current density of the drain (as specified by the circuit structure specification 708) will be divided amongst the pair of vias. If the current densities of the vias are still exceeded, another (third) via may be attempted which (again) may cause the width of the drain wire 725 to further expand. Eventually, either: 1) enough vias are added such that the via current density specified by the foundry design rules is not exceeded and the drain wiring 725 width does not expand so as to violate a design rule (e.g., by encroaching upon the neighboring drain wire 726); or, 2) the designer is informed that the design is not feasible. The same techniques/concerns may be applied when implementing via 730 between drain wire 726 and drain contact wire 741.

Once the layout is placed as observed in depiction $720_5$ (i.e., after the drain vias 729, 730 have begun to be placed and defined $701_5$), the gate vias begin to be placed and defined $701_6$. From the generic layout description (as observed in FIG. 4), it is apparent that transistor Q1 is connected to gate wire 0 and transistor Q2 is connected to gate wire 1. Using this information (which corresponds to input $711_6$), a first 727 of the pair of gate wires is identified as wire 0 and a second 728 of the pair of wires is identified as wire 1. As such, a first via 731 is configured to connect gate wire 727 to the gate pad layer 742 of the first gate structure 721 (which corresponds to the gate of transistor Q1); and, a second via 732 is configured to connect gate wire 728 to the gate pad layer 743 of the second gate structure 722 (which corresponds to the gate of transistor Q2).

Finally, once the layout is established as observed in depiction $720_5$ (i.e., after the gate vias 731, 732 are configured $701_6$), the source via(s). begin(s) to be placed and defined $701_7$. From the generic layout description (as observed in FIG. 4), it is apparent that a single via 733 may be used (because a differential pair has a common source node). However, the number of vias may need to be increased so as not to exceed the foundry specified current density per via requirement; which, in turn, may cause the width of the source wiring 724b to expand. At this point, the placement and definition of the basic layout should be complete.

Before continuing to a discussion of techniques that may be used for replicating the basic layout a few comments are in order. Most notably, it is important to emphasize that the specific order of which structural embodiments begin to be placed and defined may vary from embodiment to embodiment. For example, according to just a few potential alternative approaches: drain wiring may be placed before source wiring; and/or gate wiring may be placed before drain wiring; and/or contacts and/or vias may be placed before wiring, etc. Furthermore, note that the specific structural elements correspond to field effect transistors (e.g., gate, source, drain). Those or ordinary skill, however, will be able to readily apply the teachings herein so as to apply to devices other than FETs such as bipolar transistors (e.g., having a base, emitter and collector).

6.2 Replicating A Basic Layout

Figure 9:
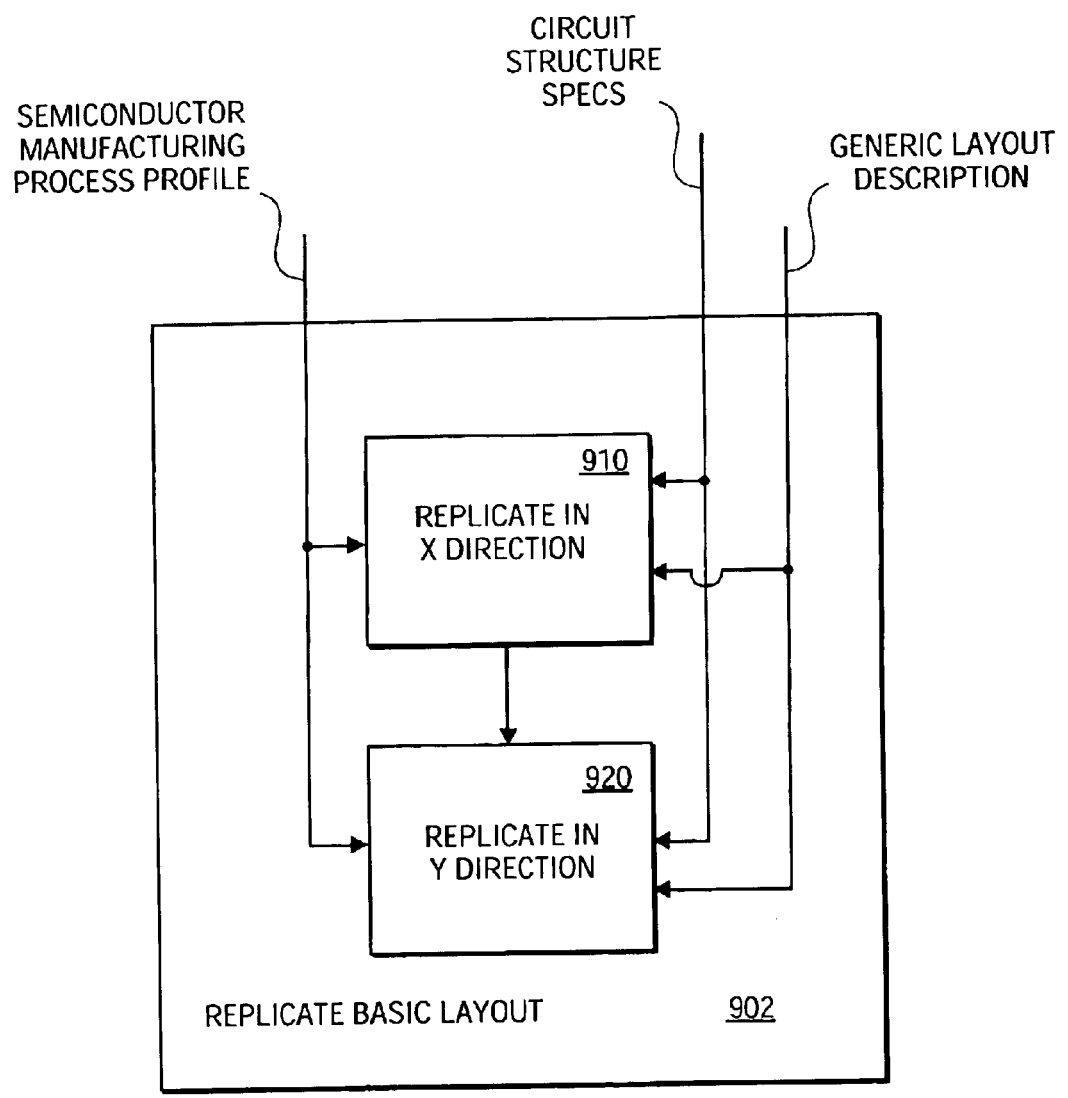
FIG. 9 is a flow chart illustrating a replication of a basic layout according to one embodiment of the present invention.

The above discussion, referring back to FIG. 5, related to one or more methodologies as to how a basic layout may be constructed 501. The present section relates to how a basic layout may be replicated 502 so as to effectively expand the transistor sizes of the circuit structure type that the basic block corresponds to. FIG. 9 shows a more detailed embodiment as to how a basic layout may be replicated. 902. According to the approach of FIG. 9, a layout block is first replicated along the x axis 910 (i.e., in a direction that is perpendicular to the gate fingers) to form a row of layout blocks; then, the row of layout blocks is replicated along the y axis (i.e., in a direction that is parallel with the gate fingers).

Figure 10:
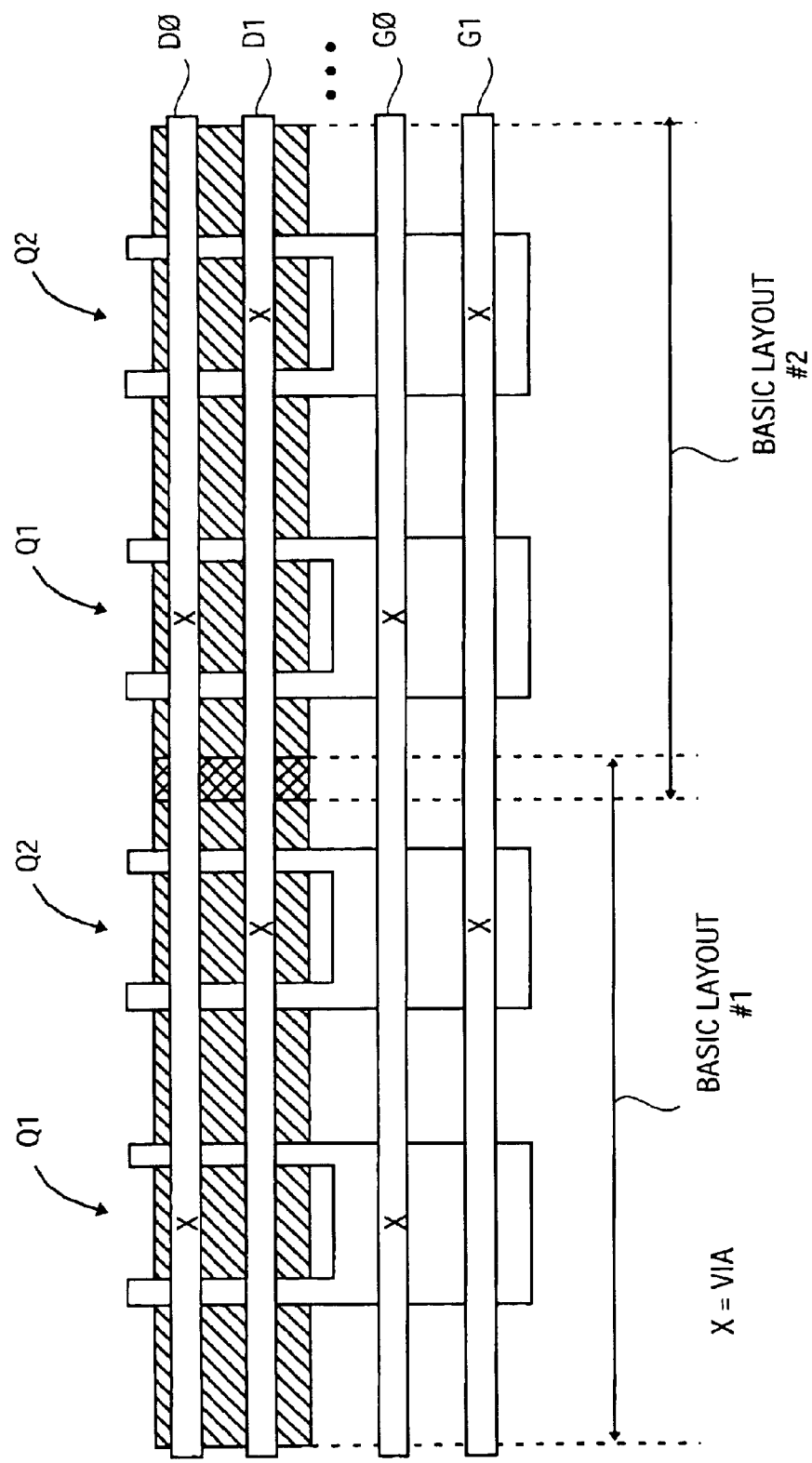
FIG. 10 illustrates an embodiment of a result of replicating a basic layout in the x direction.

FIG. 10 (which has eliminated metal 1 features for ease of drawing) demonstrates some techniques that may be used to enhance the overall layout as it replicates layout blocks in the x direction. Again, the example of a differential pair is used. To first order, note that (according to one interpretation of the particular circuit structure characterization observed in FIG. 3, the number of times a basic layout is replicated corresponds to $m_x$. Thus, in this case, the number of replications in the x direction is specified as part of the definition of the circuit structure itself.

According to the example of FIG. 10, the basic layout is replicated in the x direction such that: 1) neighboring basic layouts overlap one another to some extent to increase the packing density of the circuit; and 2) the transistors (Q1 and Q2) are effectively interleaved so that their characteristics are approximately the same when actually manufactured into a semiconductor chip. In the former case (overlap), the rightmost edge of basic layout #1 has an overlapping diffusion region with leftmost edge of basic layout #2. Here, as the layout of the circuit structure is effectively "built up" in software by the replication process, the diffusion regions of the two neighboring blocks may be overlapped because a differential pair is a "common source" structure.

That is, two different transistors having a common source may share the same source finger. As such, the diffusion region of neighboring gate structures may be merged. Insight into the fact that a common source structure is at hand can be gained from the generic layout description (which, as seen in the embodiment of FIG. 4, indicates that only one source wire is present in the layout. With respect to the second case (interleaving), interleaving corresponds to the alternating of transistor gate structures so that the transistors do exhibit common variation from gate structure to gate structure across the surface of a semiconductor wafer (should any exist). As such, note that the gate and drain wiring (G0 and G1; D0 and D1) such that the first and third gate structures correspond to Q1 of the differential pair; and the second and fourth gate structures correspond to Q2 of the differential pair.

Figure 11:
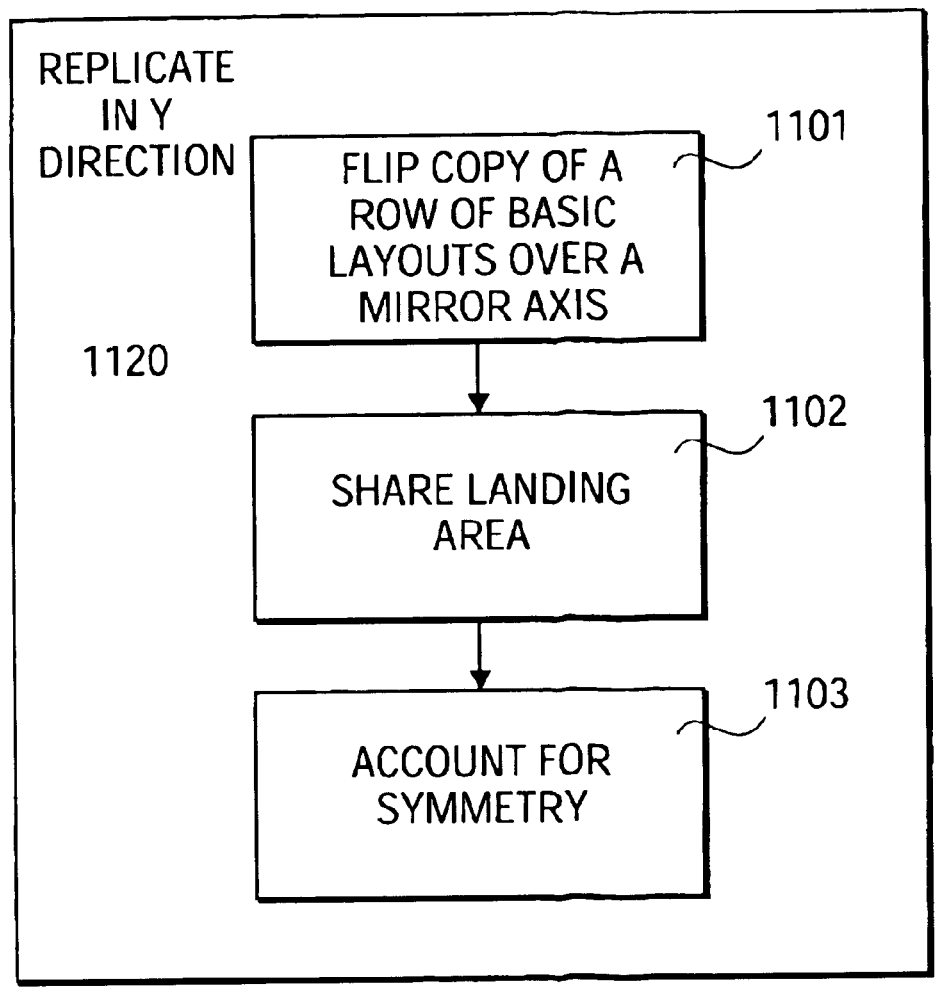
FIG. 11 illustrates an embodiment of a methodology that may be used to replicate in the y direction.

Once a basic layout has been properly replicated in the x direction, the row of layout blocks that results may be replicated along the y axis to further expand the transistor size. FIG. 11 shows an embodiment of a methodology 1120 that may be used for replication in the y direction; and, FIG. 12 corresponds to a depiction of a resultant layout if the row of FIG. 10 were to be replicated in the y direction according to the process of FIG. 11.

According to the methodology 1120 of FIG. 11, the row of blocks observed in FIG. 10 were "flipped over" a mirror axis. A mirror axis is an axis along the x direction that is positioned within or proximate to the landing area of the gate structures in the row (or, alternatively, at or proximate to the tips of fingers of the gate structures in the row). By flipping a duplicate copy of the row over a mirror axis 1101 positioned proximate to the landing area, the fingers of the new "lower" row will point "down" in the −y direction.

Figure 12:
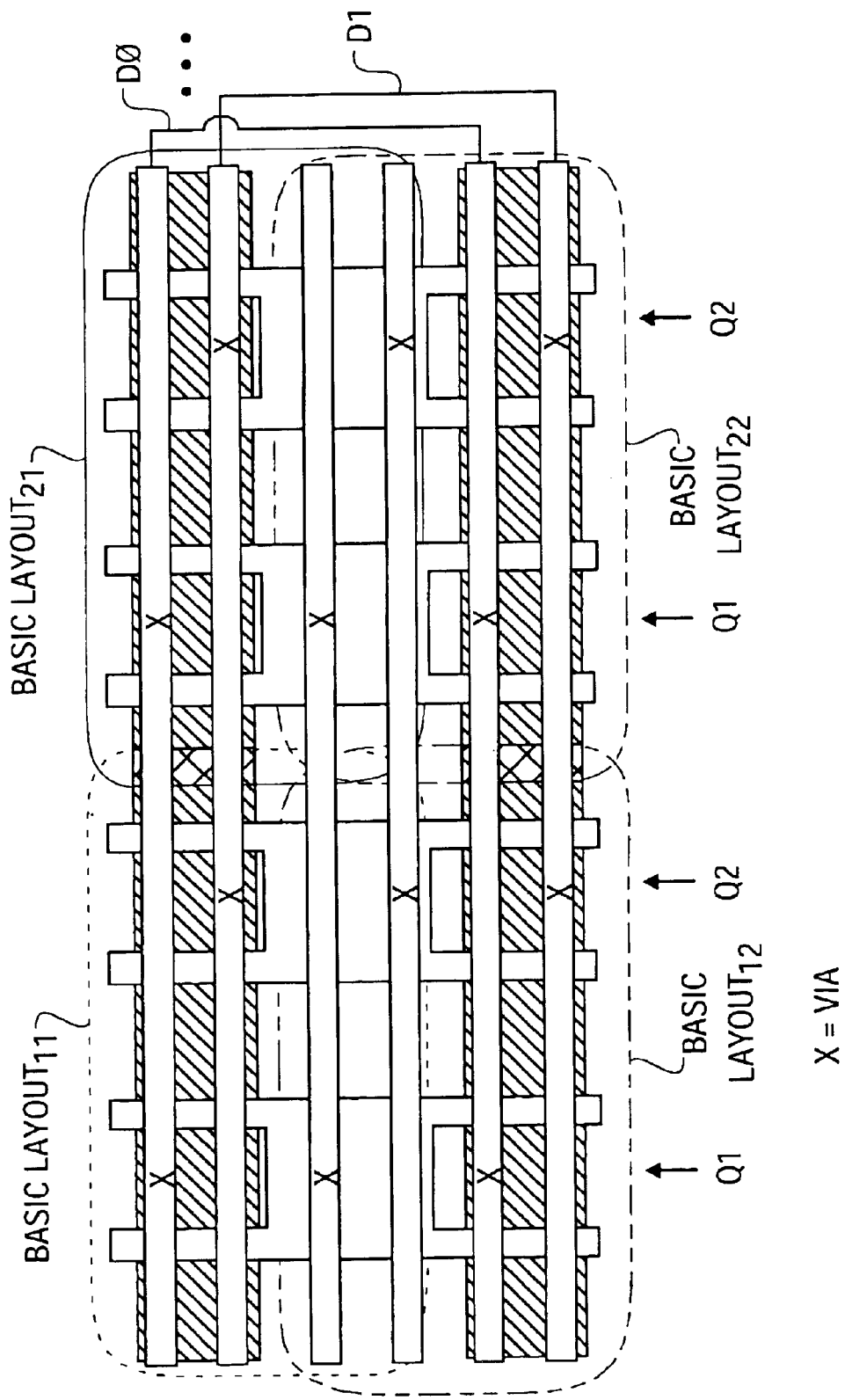
FIG. 12 illustrates an embodiment of a result of replicating, in the y direction, the replicated depiction of FIG. 10.

Then the landing areas of the gate structures are shared as between gate structures that are vertically aligned with respect to one another as seen in FIG. 12. Better said, the lower row of layout blocks overlaps the higher row of layout blocks such that the same landing area is used for gate structures that are mirror images of one a another across the mirror axis that was flipped over. This effectively provides good packing density in the y direction; and, as the row was packed in the x direction, real estate efficiency is observed in both the x and y directions. As such, as seen in FIG. 12, basic layouts 11 and 12 overlap the diffusion regions of basic layouts 21 and 22, respectively; and basic layouts 11 and 21 overlap the gate structure landing areas of basic layouts 12 and 22, respectively.

The methodology of FIG. 11 also indicates that symmetry between transistors Q1 and Q2 is to be accounted for. Here, note that the contacts and vias of both rows are are arranged inapposite to one another. That is, whereas the top row places drain/diffusion contacts and gate vias closer to the finger tip edges for transistor Q1 than Q2; by contrast, the bottom row places drain/diffusion contacts and gate vias closer to the finger tip edges for transistor Q2 than Q1. Before continuing notice that by executing the methodologies discussed above with respect to FIGS. 9 through 12 in software, the transistors of a basic layout can be automatically expanded in such a manner that accounts for symmetry and conserves semiconductor surface area consumption.

7.0 Other Circuit Structure Types and Their Corresponding Basic Layout

So far, the example of a differential pair has been discussed. However, the basic layout approach of FIGS. 8a through 8c (as well as the wiring scheme discussed with respect to FIGS. 7a and 7b) may be used to construct basic layouts for other types, of circuit structures that can be easily be described in a generic fashion (e.g., according to the approach observed in FIG. 4). FIGS. 13 through 17 relate to various specific examples. Note that any of the basic layouts of FIGS. 13 through 17 may also be replicated in the x and y direction (as discussed above) so as to expand the transistor(s) associated with these structures.

Referring back to FIG. 4, recall that an embodiment for a generic layout description was discussed. In the following discussion, specific examples of different basic layouts will be discussed in relation to different numeric values that are "plugged into" the syntax observed in FIG. 4. As discussed with respect to FIG. 4, recall that the embodiment of the generic layout description disclosed therein comprises Boolean variables to identify if any of the nodes of a single transistor need to be connected to each other. For example, a current mirror circuit structure requires a transistor having a gate node that is connected to its drain node. Here, a Boolean variable "connect_drain_to_gate" may be set to True (e.g., "I") if a particular circuit element requires a gate node to be connected to the drain node; and the variable is set to False (e.g., "0") value, if the circuit element does not require the gate node to be connected to the drain node. In addition, some circuit structures require the source node to be connected to the drain node (e.g., an MOS capacitor). Thus, a Boolean variable "connect_drain_to_source".may be set to True value.(e.g., "1"), if particular circuit element requires the source node to be connected to the drain node; and, the variable may be set to False value (e.g., "0") if the connection between the source node and the drain node is not required.

Figure 8B:
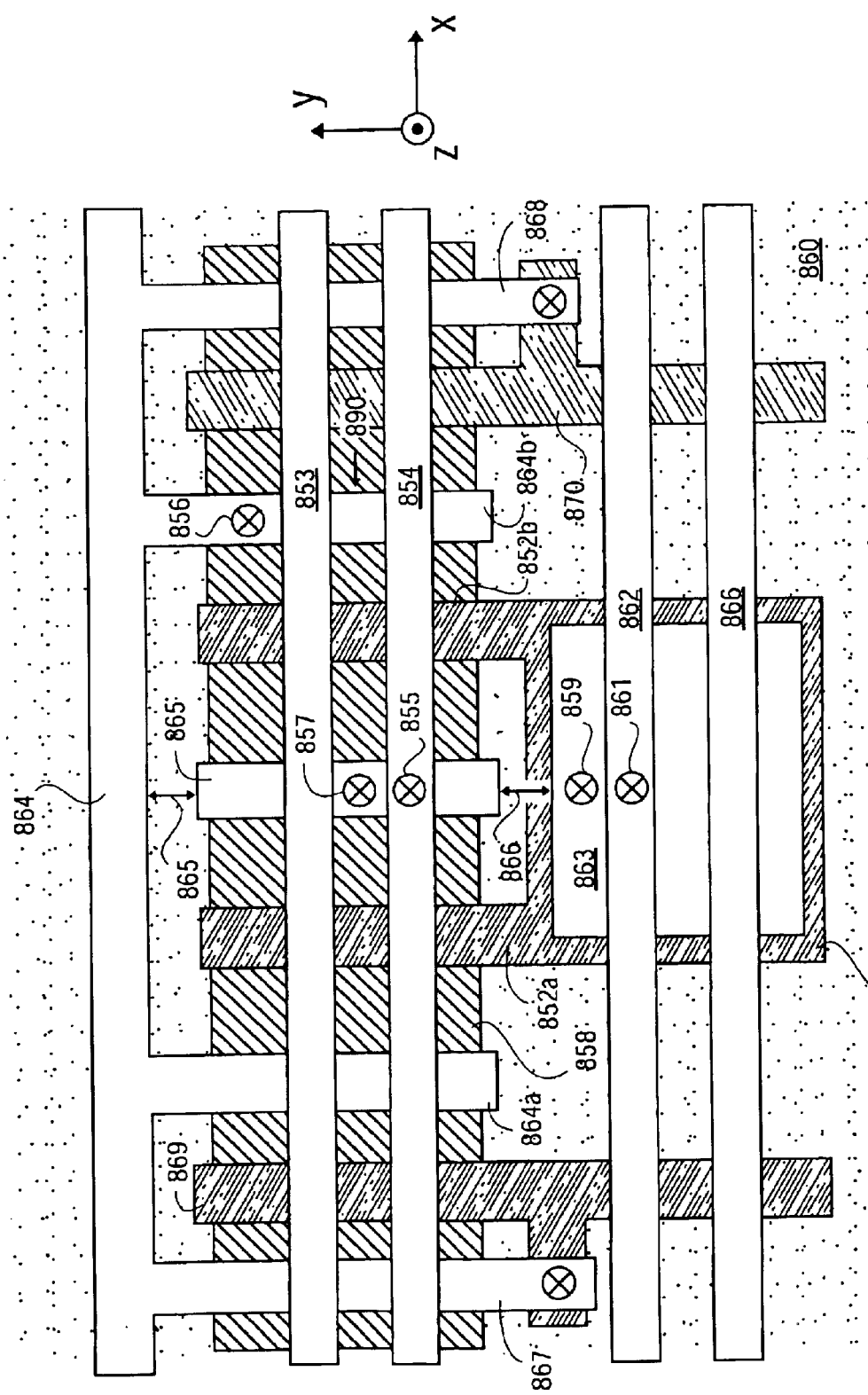
FIG. 8B illustrates a top view of generic layout strategy that may be used to generate a layout for more than one type of circuit structure.
Figure 8C:
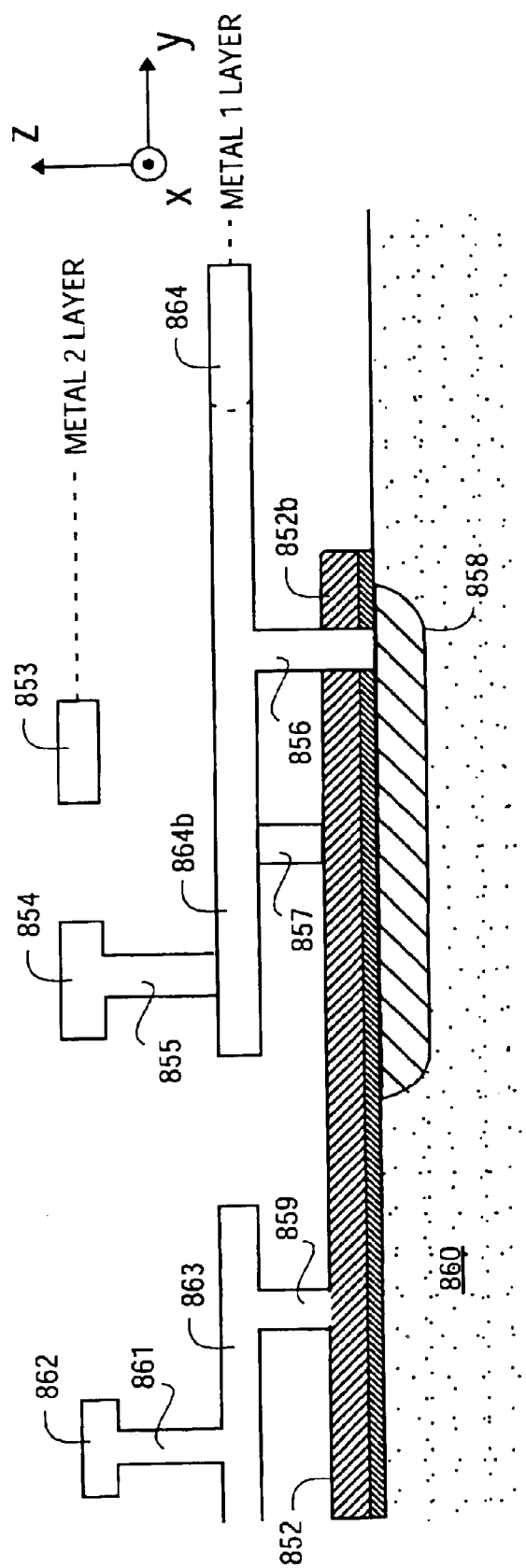
FIG. 8C illustrates a cross sectional view of generic layout strategy that may be used to generate a layout for more than one type of circuit structure.

On this point, before continuing with a detailed discussion of some possible circuit structure embodiments, note the ease at which the layout approach of FIG. 8b allows for "drain_to_source" and "drain_to_gate" connections to be made. Specifically, because the source wiring 864 along the x axis runs along the same metal layer (metal layer 1) as the drain contact wire 865; and because the drain contact wire 865 is proximate to (e.g., by running along the y axis so as to "point to") this same source wiring 864 section, a drain-to_source connection can be easily configured by "filling in" space 865 with metal 1 layer conductive material. This configuration may be made, for example, by extending the width of the drain contact wire 865 (as measured along the y axis) so that it touches wiring 864. The extension may be easily configured in software, for example, by setting the coordinates that describe the drain wiring "rectangle" so that it touches or overlaps with the coordinates of the source wiring 864.

Likewise, because the gate pad layer 863 runs along the same metal layer (metal layer 1) as the drain contact wire 865; and because the drain contact wire 865 is proximate to (e.g., by running along the y axis so as to "point to") the gate pad layer 863, a drain-to-gate connection can be easily configured by "filling in" space 866 with metal 1 layer conductive material. This configuration may be made, for example, by extending the width of the drain contact wire 865 (as measured along the y axis) so that it touches gate pad layer 863. The extension may be easily configured in software, for example, by setting the coordinates that describe the drain wiring "rectangle" so that it touches or overlaps with the coordinates of the gate pad layer 863. These points will be reiterated, as appropriate, in the discussion immediately below which reviews some basic circuit structures that may be easily formulated with the layout strategy of FIG. 8b and the wiring scheme of FIG. 7A.

Differential Load

Figure 13:
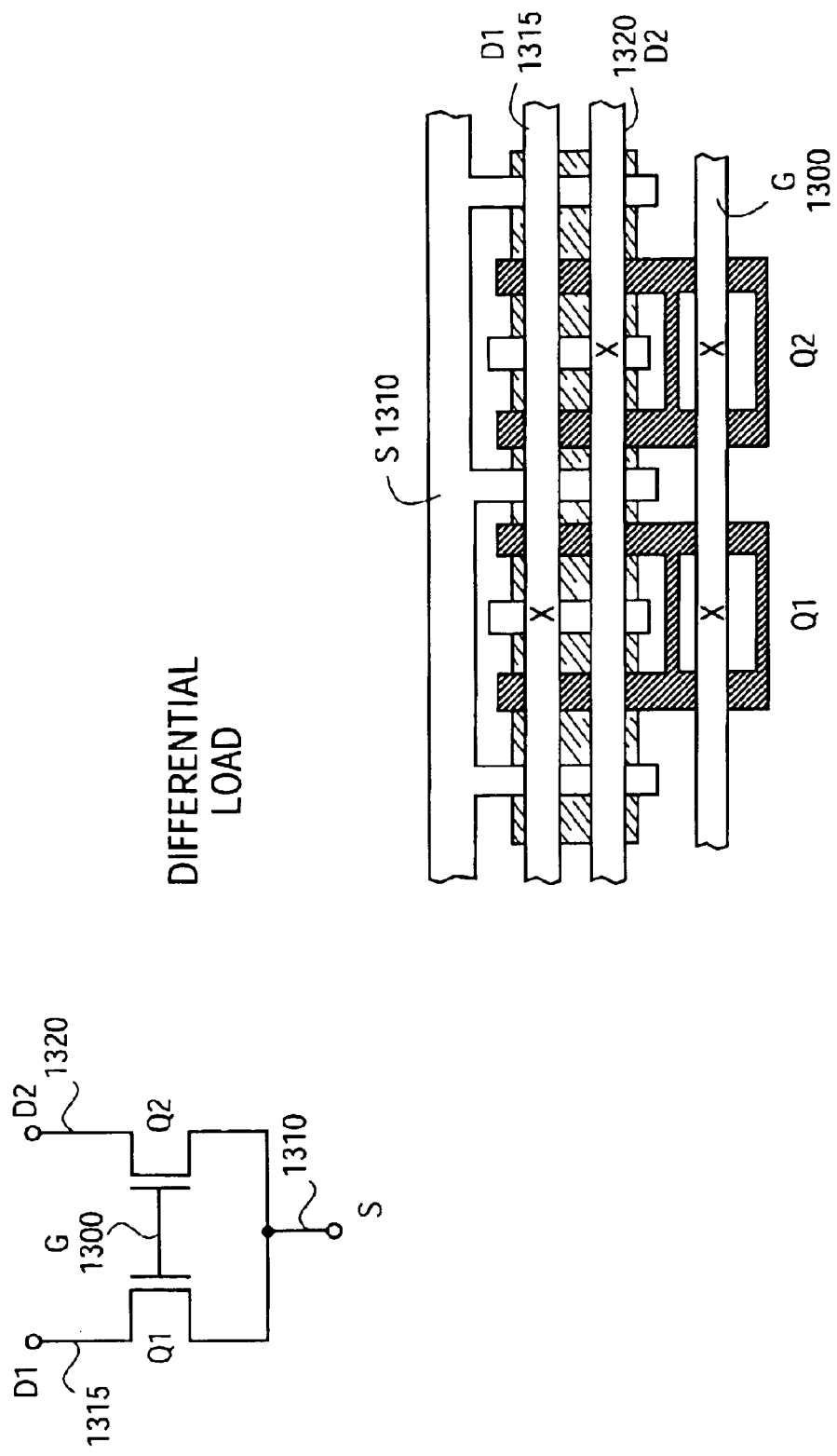
FIG. 13 illustrates an embodiment of a layout for a differential load.

FIG. 13 illustrates a schematic representation of a differential load and an exemplary generic layout of a differential load based on a generic layout description of the differential load. The generic layout description (in accordance with the specific syntax embodiment of FIG. 4) of the differential load may be the following:

(2; 1; 1), (L2; 0; 0; 0; 0; 0), (L2; 1; 0; 0; 0; 0).

As illustrated in FIG. 13 the differential load comprises two drain nodes 1315 and 1320, one gate node 1300, and one source node 1310. Therefore, the generic layout of the differential load comprises two drain wires, one gate wire and one source wire that are represented by the first part of the generic layout description (2, 1, 1) presented above. In addition, as illustrated in FIG. 13, the differential load comprises two transistors Q1 and Q2. Note that the description for each of transistors Q1, Q2 calls out an L2 gate structure. Because the differential load comprises two drain nodes and as a result requires two separate drain wires 1315, 1320, the generic layout description identifies to which drain wire each transistor is connected. For example, the first transistor's Q1 drain node is connected to the first drain wire 1315 ("0") and the second transistor's Q2 drain node is connected to the second drain wire 1320 ("1"). The vias depicted in FIG. 13 illustrate the above described wiring pattern.

In addition, one gate wire 1300 and one source wire 1310 are included in the layout. These are specified by the later "1; 1" portion of the ("2; 1; 1") generic wiring description for the overall circuit structure. As such, both transistors Q1 and Q2 share common source wiring 1310 and common gate wiring 1300. Note that the syntax expressed above indicates that both transistors are connected to the same gate and source wiring as is evident by the "0; 0" in the initial "L2; 0; 0" expression for each transistor Q1, Q2. As such, only one source wire 1310 and only one gate wire 1300 needs to be drawn. The vias to the gate pad layer indicate the appropriate connectivity with respect to the gate. As illustrated in FIG. 13, the differential load does not require connections between the source node and the drain node and/or the gate node and the drain node, thus the Boolean variables connect_source_to_drain and connect gate_to_drain are set to False values.

Current Mirror

Figure 14:
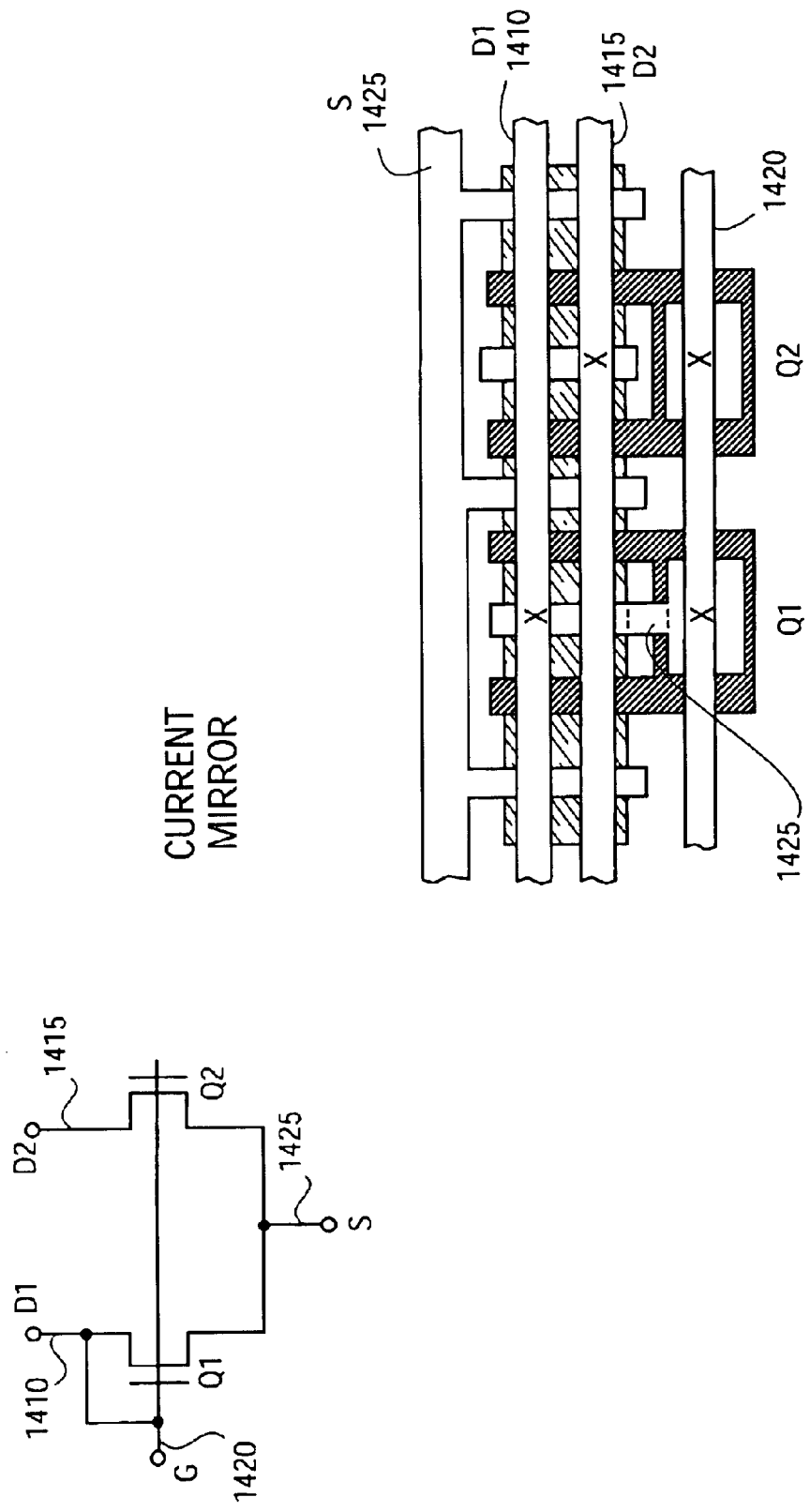
FIG. 14 illustrates an embodiment of a layout for a current mirror

FIG. 14 illustrates a schematic representation of a current mirror. As illustrated in FIG. 14 the current mirror comprises one gate node, one drain node and one source node, and the gate node is connected to the drain node. A generic layout description of the current mirror that corresponds to the general format described in Section 5.0 is the following:

(2; 1; 1), (L2; 0; 0; 0; 0; 1), (L2; 1; 0; 0; 0; 0).

As represented by the first part of the generic layout description, the current mirror layout comprises two drain wires 1410, 1415, one gate wire 1420 and one source wire 1425. Note also that the generic layout description calls out an L2 structure for each of transistors Q1 and Q2. The generic descriptions for the transistors Q1, Q2 also indicate which drain wire each is connected to. For example, the drain node for the first transistor Q1 is connected to the "0" drain wire 1410 as specified by the following underlined portion of the generic description layout for the first transistor: (L2; 0; 0; 0; 0; 1); and, the drain node for the second transistor Q2 is connected to the "1" drain wire 1415 as specified by the following underlined portion of the generic description layout for the second transistor: (L2; 1; 0; 0; 0; 0). The vias connected to the drain wiring illustrate this approach.

In addition, the current mirror requires the gate node to be connected to the drain node for transistor Q1, and thus the connect_gate_to_drain Boolean variable is set to True value an indicated in the underlined portion of the Q1 description: (L2; 0; 0; 0; 0; 1). As such, metal 1 layer region 1425 corresponds to an extended drain contact wire for transistor Q1 that touches the Q1 gate pad layer. The connect_source_to_drain variable is set to False value for both transistors because the current mirror does not require a connection between the source node and the drain node. Finally, from the syntax its apparent that both transistors are connected to the same gate wire 1420 and source wire 1425 from the following underlined portions of their generic layout descriptions: (L2; 0; 0; 0; 0; 1), (L2; 1; 0; 0; 0; 0). The common source wiring arrangement 1425 and the vias to the gate pad layers for Q1 and Q2 illustrate this approach. It will be noted that upon replication of the L2 structures, source connections may be shared by the L2 structures placed next to each other in the x axis direction.

Transistor

Figure 15:
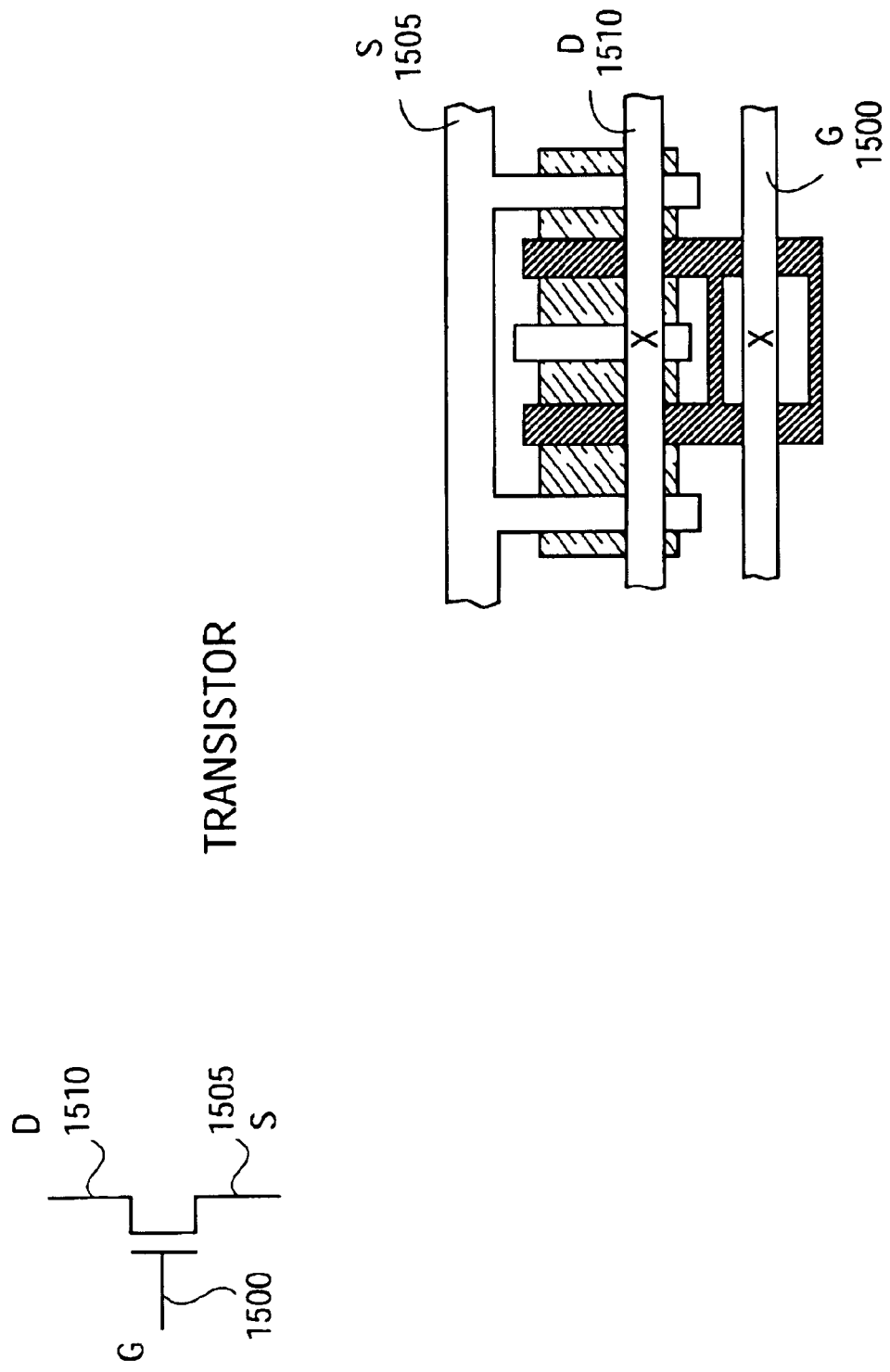
FIG. 15 illustrates an embodiment of a layout for a transistor.

FIG. 15 illustrates a schematic representation and generic layout of a transistor generated according to a generic layout description of the transistor that is the following:

(1; 1; 1), (L2; 0; 0; 0; 0; 0).

As shown by the schematic representation in FIG. 15, the transistor has one gate node 1500, one drain node 1510 and one source node 1505. Therefore, the layout requires one drain wire, one gate wire and one source wire as represented by the first part of the generic layout description (1; 1; 1). In addition, a layout of a simple transistor comprises one L2 structure as specified in the second part of the generic layout description (L2; 0; 0; 0; 0; 0). Moreover, because the transistor does not require the source node to be connected to the drain node and the gate node to be connected to the drain node, the Boolean variables connect_source_to_drain and connect_gate_to_drain are set to False value.

MOS Capacitor

Figure 16:
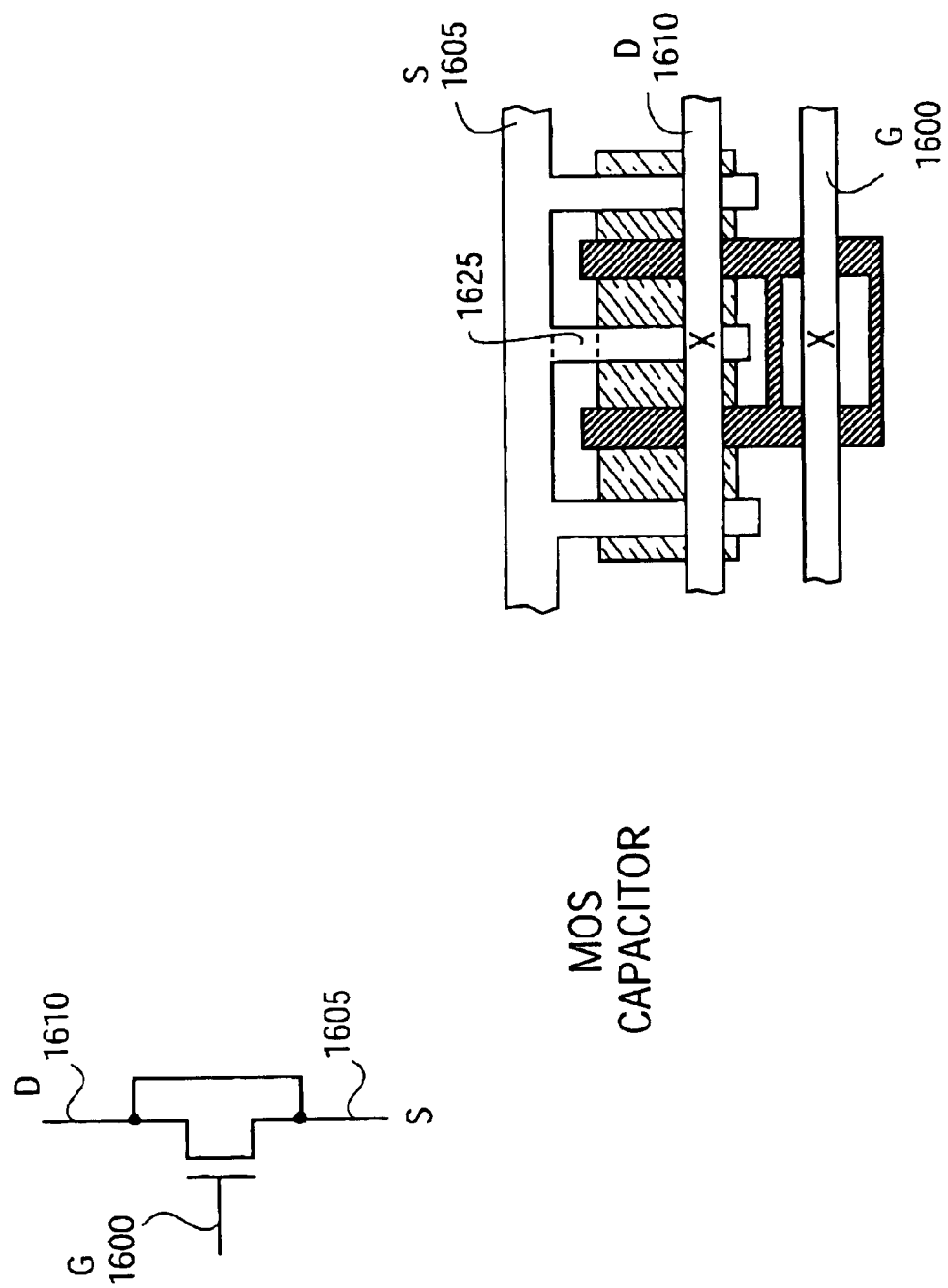
FIG. 16 illustrates an embodiment of a layout for a capacitor.

FIG. 16 illustrates a schematic representation of a MOS capacitor that comprises one gate node 1600, one source node 1605 and one drain node 1610. As illustrated in FIG. 16, the source node 1606 and the drain node 1610 are connected. The layout of the MOS capacitor is generated according to the generic layout description, which is the following:

(1; 1; 1), (L2; 0; 0; 0; 1; 0).

Because the MOS capacitor comprises single source, drain and gate nodes, the layout requires a single drain wire 1610, gate wire 1600 and source wire 1605 as represented by the first portion of the generic layout description (1; 1; 1). In addition, the MOS capacitor includes one transistor and thus the generic layout comprises one L2 structure. The MOS capacitor requires the source node to be connected to the drain node and hence, the connect_source_to_drain variable is set to a True value. The connect_gate_to_drain variable is set to a False value. Here, note that region 1625 of the metal 1 layer corresponds to an extension of the drain contact wire to the source wiring 1605.

Diode

Figure 17:
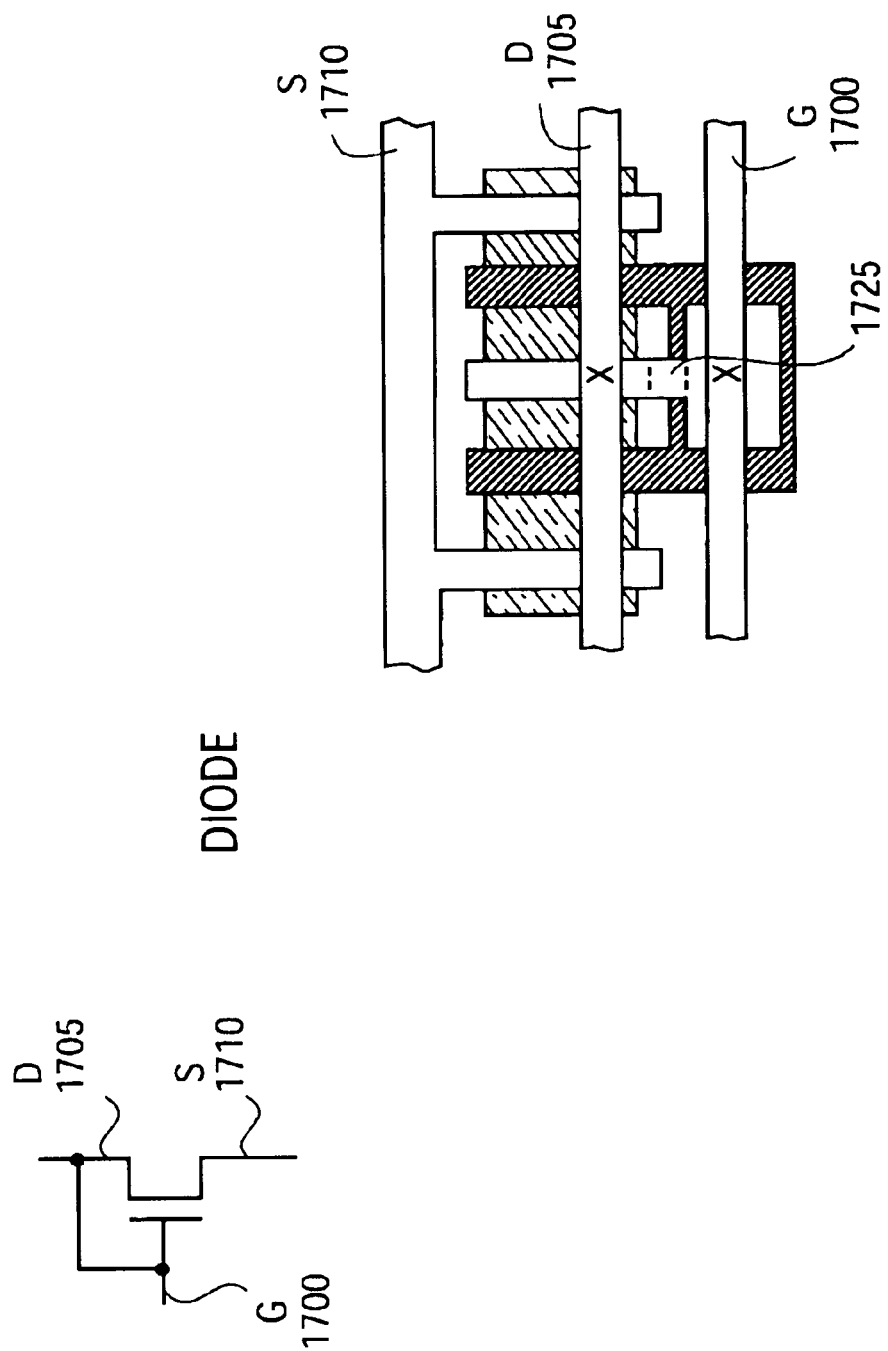
FIG. 17 illustrates an embodiment of a layout for a diode.

FIG. 17 illustrates a schematic representation of a diode including one gate node 1700, one drain node 1705 and one source node 1710. FIG. 17 also illustrates a generic layout of the diode according to a generic layout description, which may be expressed as the following:

(1; 1; 1), (L2; 0; 0; 0; 0;1).

Because the diode requires a single gate, a single drain and a single source, the layout of the diode comprises one drain wire, one gate wire and one source wire, which is represented by the first portion of the generic layout description (1; 1; 1). In addition, the diode comprises a single transistor and thus the layout includes a single L2 structure, which is represented by the second portion of the generic layout description (L2; 0; 0; 0; 0; 1). Note that the syntax indicates the gate is to be connected to the drain which is accomplished by extending the drain contact wire (via metal 1 region 1725) so as to touch the gate pad layer.

Dummy Elements

Before continuing to the next section, note that the circuit specification (as illustrated in FIG. 3) may further describe whether or not a particular transistor should be constructed with dummy elements (e.g., via the dummy flags illustrated in FIG. 3). Dummy elements are used to keep the regions of electron flow within the diffusion region (for a circuit structure's active transistors) away from the diffusion area edges (because implant inhomogeneities may exist there). Examples of dummy elements appear in FIG. 8b as metal 1 fingers 867, 868 in conjunction with poly fingers 869, 870. Here, by incorporating the presence of these structures into the design, a transistor's source and drain regions (e.g., between source fingers 864a and 864b) are far removed from the diffusion area edges (that run along the y axis).

By specifying that a transistor is to have dummy elements (e.g., through the circuit structure specification of FIG. 3), the automatic design layout methodology can be configured to automatically add these features 867, 868, 869, 870 (e.g., as additional poly features at methodology $701_1$ and as metal 1 features at methodology $701_2$ of FIG. 7A) if the circuit structure specification indicates to do so. Note that this feature is optional according to the circuit structure specification embodiment of FIG. 3. Thus if a circuit structure specification declares that no dummy features are to be constructed (e.g., dummy element flag=0) then dummy features are not constructed; or, by contrast, if a circuit structure specification declares that dummy features are to be implemented (e.g., dummy element flag=1) then dummy features are constructed. In the former case (where dummy features are not constructed), in an embodiment, an attempt is made to set the edges of the diffusion region 858 that run along the y axis are set as close to the source fingers 864a, 864b as the applicable foundry design rules will allow.

It will be appreciated by one skilled in the art that variety of other circuit elements may be generically described utilizing the above-described generic layout description method. It will be noted that the present invention is not limited to the above-described circuit elements.

In addition, it will also be appreciated that generic descriptions of circuit elements may be automatically generated, upon the user specifying characteristics of a particular circuit element. The automatically generated generic descriptions then may be stored in the generic layout description database 205. Alternatively, the generic descriptions may be manually provided by the designer to the software application and stored in the generic layout description database 205.

8.0 Floorplan Generation For A Basic Building Block

Figure 18:
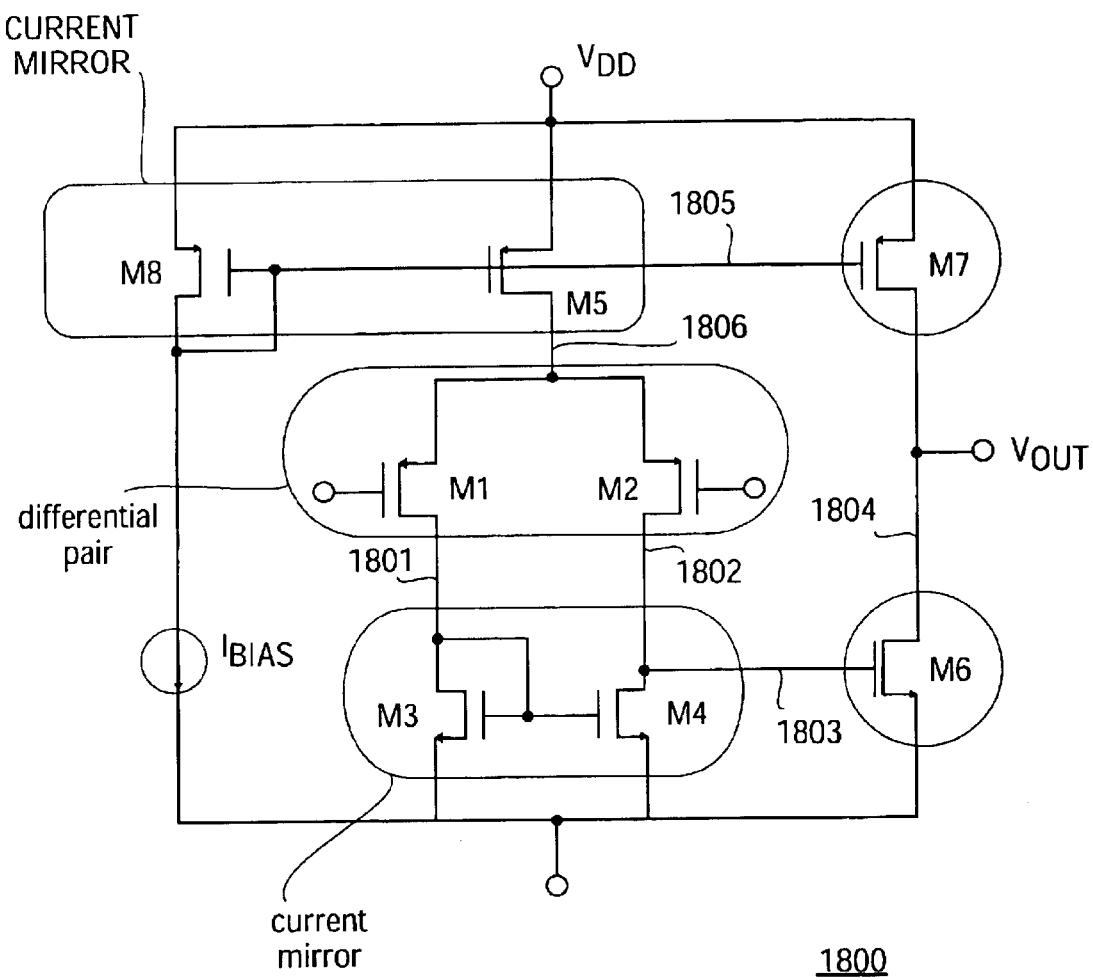
FIG. 18 illustrates an embodiment of a basic building block that is comprised of a plurality of circuit structures.

As alluded to at the beginning of Section 3.0, circuit structures may often be combined together to form a basic building block. An embodiment of a basic building block is observed in FIG. 18, wherein, a design for an operational amplifier 1800 is observed. Here, note that the operational amplifier 1800 may be viewed as being comprised of a pair of transistors (M7 and M8); a differential pair (constructed with transistors M1 and M2) and a pair of current mirrors (a first current mirror constructed with transistors M3 and M4; and, a second current mirror constructed with transistors M5 and M8). Accordingly, a layout for each of these circuit structures may be automatically generated according to the process depicted in FIG. 2; and, the resulting layouts may be combined in some manner so as to form a "floorplan" for the larger scale, amplifier building block 1800.

Figure 19:
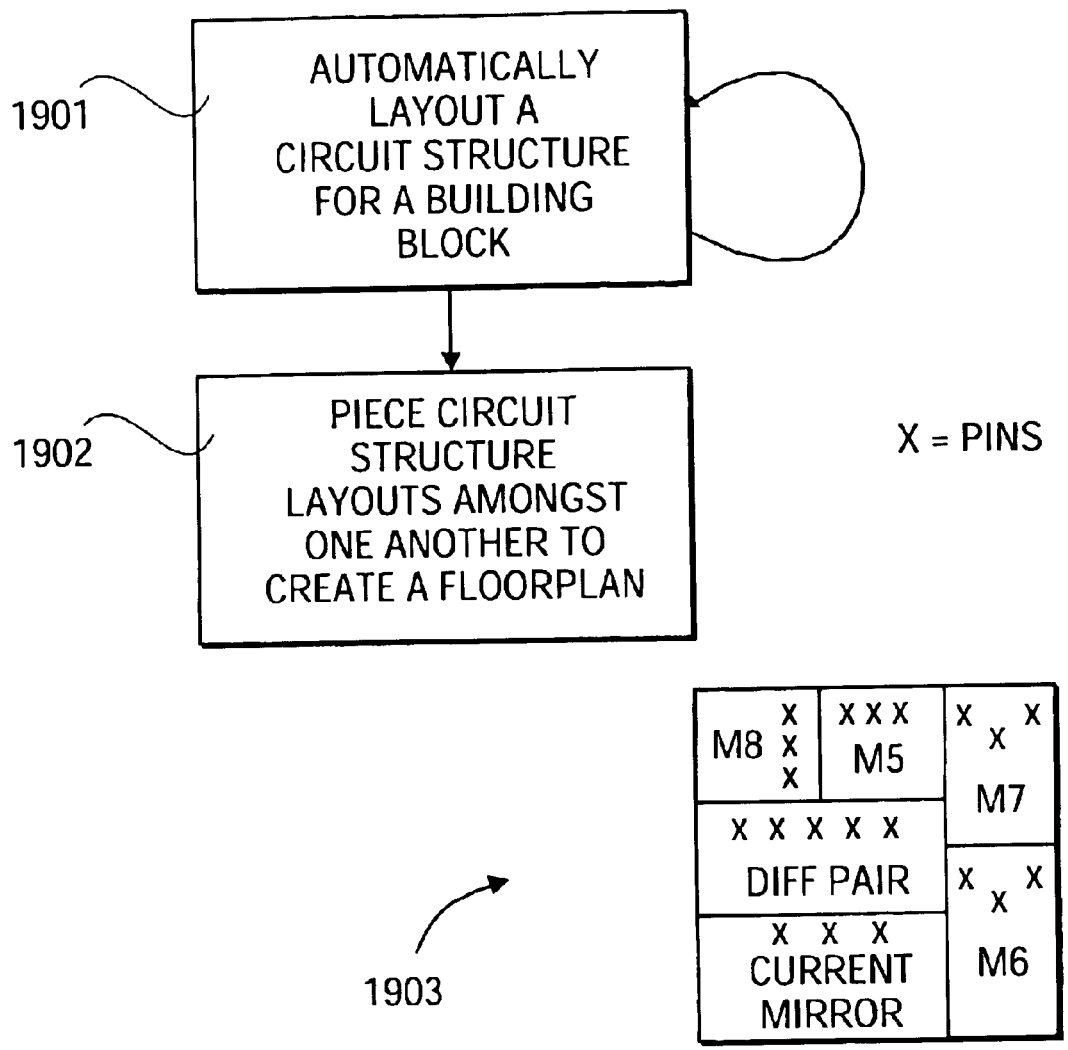
FIG. 19 illustrates an embodiment of a methodology that may be used to build a floorplan for a building block that is comprised of a plurality of circuit structures.

FIG. 19 shows an example in greater detail. According to the methodology of FIG. 19, the methodology 200 of FIG. 2 may be employed to automatically layout 1901 a circuit structure for a building block (such as amplifier 1800 of FIG. 18). The process 1901 is repeated for each circuit structure in the building block. Thus, in the case of the exemplary amplifier 1800 of FIG. 18, five different layouts may be automatically generated (one for each of transistors M7 and M8, one for the differential pair (M1 and M2) and one for each of the pair of current mirrors (M3 and M4; and, M5 and M8)).

The completed layouts may then be merged together in software so as to form a floorplan for the building block. An exemplary floorplan 1903 for the amplifier 1800 of FIG. 8 is observed in FIG. 19. Here, the layout of each circuit structure identified above is indicated in the floorplan. In an embodiment, each separate node associated with a circuit structure (e.g., the two gate nodes, the two drain nodes and the source node associated with a differential pair), may have a corresponding logical marker where connections from circuitry outside the circuit structure can be connected.

Each logical marker may then be used as a "pin" to which the routing wires (e.g., routing wires 1801 through 1807 of FIG. 18) that interconnect the various circuit structures together may make contact in order to form the operational amplifier as a working building block of integrated circuit structures. In an embodiment, the logical markers are placed near the periphery of the circuit structure layout. Here, a separate software routing tool may be used to determine the routing path.

9.0 Embodiment of Basic Semiconductor Manufacturing Process Design Rules

Figure 21:
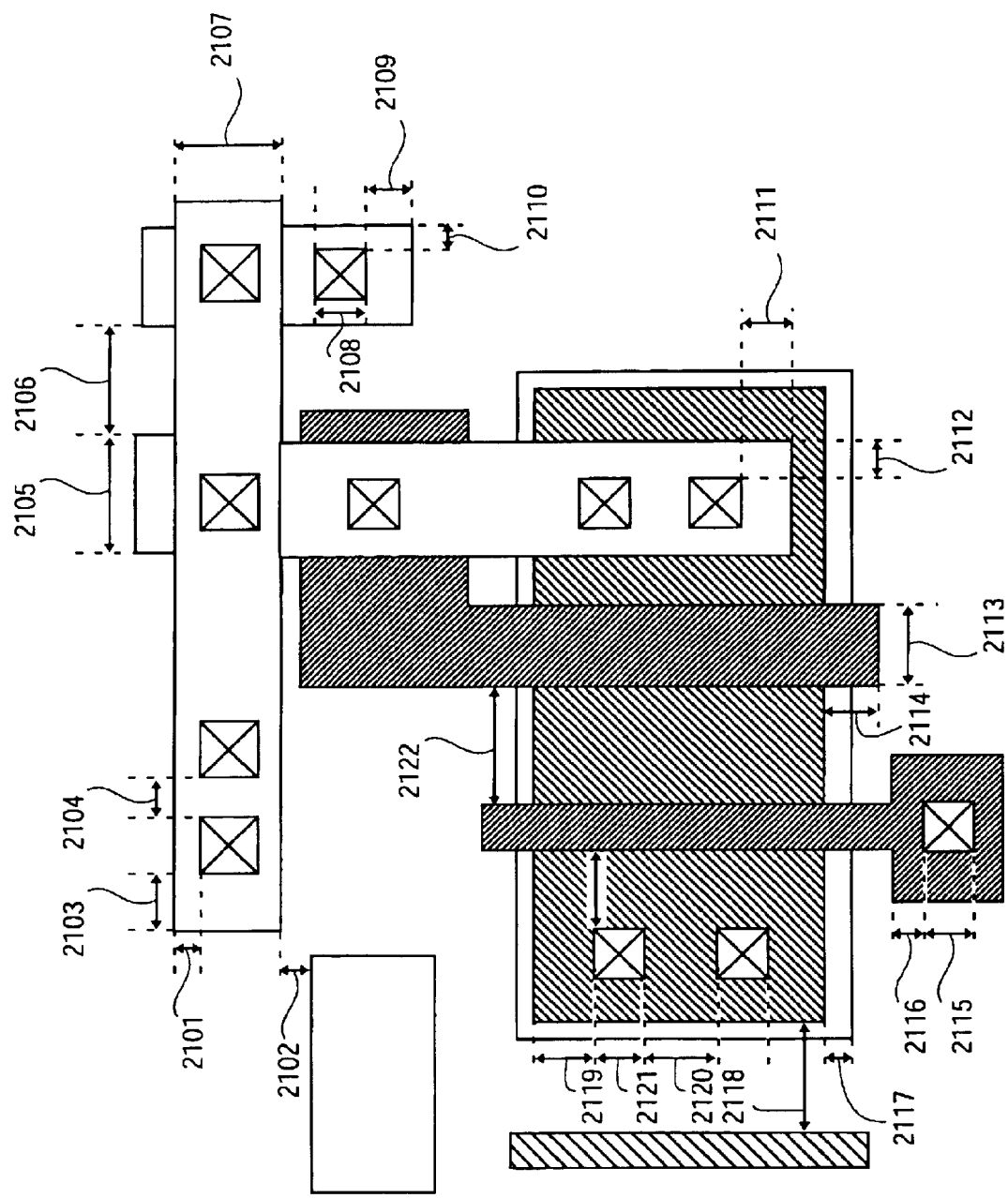
FIG. 21 shows an embodiment of a standardized format as referred to just above.

Recall from the discussion of Section 3.0 that after studying the foundry design rules of a plurality of popular manufacturers, it has been realized that at least 29 design rules are common to most all (if not all) processes; and, in one embodiment, each profile in the database 203 of FIG. 2 is therefore organized wherein these 29 rules are used to form a "basic" profile of the process. FIG. 20 provides an embodiment of a listing of these rules, most of which are illustrated in FIG. 21. For those dimensions not drawn, those of ordinary skill will be able to understand their meaning. In further embodiments, the basic profile may also include implant rules and; or rules related to the wiring of different supply voltages. It is important to note that in alternative embodiments other rules may be added; and/or dropped (from those appearing in FIG. 21) according to engineering preference(s).

10.0 Additional Comments

Figure 22:
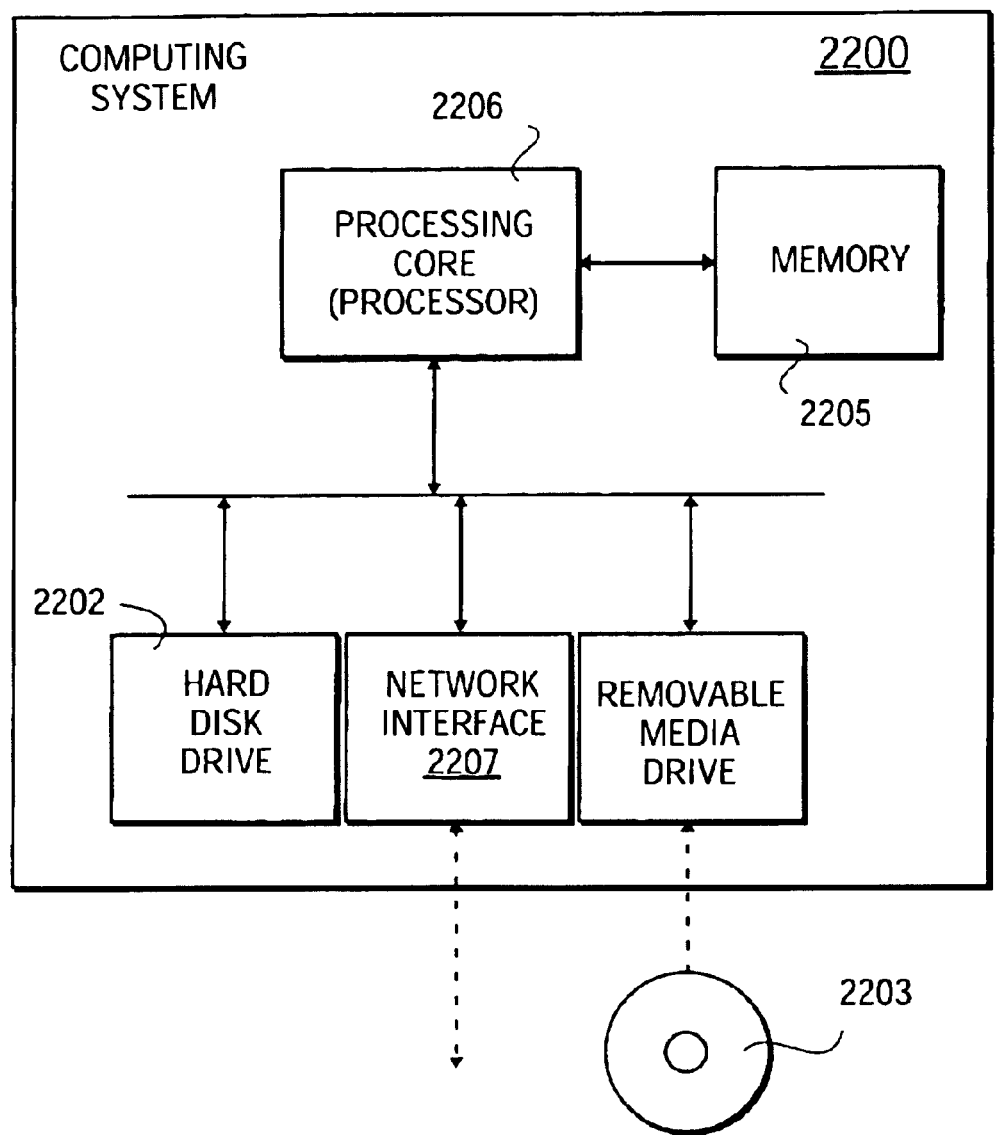
FIG. 22 shows an embodiment of a digital processing system.

FIG. 22 shows an embodiment of a computing system 2200 that can execute instructions residing on a machine readable medium (noting that other (e.g., more elaborate) computing system embodiments are possible). The instructions may be related to integrated circuit design (e.g., as described in FIGS. 2a through 21). In one embodiment, the machine readable medium may be a fixed medium such as a hard disk drive 2202. In other embodiments, the machine readable medium may be movable such as a CD ROM 2203, a compact disc, a magnetic tape, etc. The instructions (or portions thereof) that are stored on the machine readable medium are loaded into memory (e.g., a Random Access Memory (RAM)) 2205; and, the processing core 2206 (e.g., a central processing unit comprising one or more processors) then executes the instructions. The instructions may also be received through a network interface 2207 prior to their being loaded into memory 2205.

Thus, it is also to be understood that embodiments of this invention may be used as or to support a software program executed upon some form of processing core (such as the Central Processing Unit (CPU) of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, comprising:
   retrieving a generic layout description of a circuit structure from a first database that stores a plurality of generic layout descriptions, said circuit structure selected from the group consisting of:
   a) only a transistor;

b) only a diode;
c) only a capacitor;
d) only a differential load;
e) only a current mirror; and,
f) only a differential pair;

retrieving a design rule profile of a semiconductor manufacturing process from a second database that stores a plurality of semiconductor manufacturing process design rule profiles; and automatically generating a layout of said circuit structure that conforms to said generic layout description and said design rule profile.

2. The method of claim 1 wherein said design rule profile contains specific design rules for the following design rule parameters:
1. a minimum width of Metal 1;
2. a minimum spacing between two Metal 1 wires.

3. The method of claim 2 wherein said generic layout description:
a) contains a generic wiring description for the overall circuit structure from which the total number of separate nodes within the circuit structure can be identified; and
b) for each node of each transistor within said circuit structure, identifies which node amongst said separate nodes it is connected to.

4. The method of claim 3 wherein element a) of claim 3 identifies:
a) the number of separate gates nodes within the circuit structure;
b) the number of separate drain nodes within the circuit structure; and
c) the number of separate source nodes within the circuit structure.

5. The method of claim 4 wherein said generic layout description:
a) for each gate node of each transistor within said circuit structure, identifies which of said separate gate nodes it is connected to;
b) for each drain node of each transistor within said circuit structure, identifies which of said separate drain nodes it is connected to;
c) for each source node of each transistor within said circuit structure, identifies which of said separate source nodes it is connected to.

6. The method of claim 5 wherein said generic layout description also identifies for each transistor within said circuit structure whether or not its drain is connected to its source.

7. The method of claim 5 wherein said generic layout description also identifies for each transistor within said circuit structure whether or not its drain is connected to its gate.

8. The method of claim 1 wherein said automatic layout of said circuit structure also conforms to a characteristic description of each of transistor that said circuit structure is comprised of.

9. The method of claim 1 wherein each characteristic description of each transistor that said circuit structure is comprised of characterizes its corresponding transistor's speed and gain.

10. The method of claim 9 wherein said characterization of a corresponding transistor's speed and gain further comprises:
a) to characterize said corresponding transistor's speed: a first component that defines said corresponding transistor's gate finger length; and,
b) to characterize said corresponding transistor's gain: a second component that defines said corresponding transistor's gate finger width.

11. A method comprising:
fetching a profile of a manufacturing process that is to be used to manufacture a circuit structure, said profile containing specific design rules of said manufacturing process;
fetching a generic description of a layout for said circuit structure, said generic description describing said layout without reference to specific design rules of said manufacturing process, said generic description written according to a syntax, said syntax comprising:
a first location to identify the number of separate ate nodes within said circuit structure;
a second location to identify the number of separate drain nodes within said circuit structure;
a third location to identify the number of separate source nodes within said circuit structure; and,
using said profile, said generic description and a characteristic description of each transistor in said circuit structure to generate a layout for said circuit structure that is targeted for said manufacturing process.

12. The method of claim 11 wherein said fetching a profile further comprises fetching a profile from a database having a plurality of profiles, each of said profiles containing specific design rules for its own manufacturing a process.

13. The method of claim 11 wherein said profile contains specific design rules for the following design rule parameters:
1. a minimum width of Metal 1;
2. a minimum spacing between two Metal 1 wires.

14. The method of claim 11 wherein said syntax further comprises:
for each node of each transistor within said circuit structure:
(i) a first location to identify which of said separate gate nodes its gate node is connected to;
(ii) a second location to identify which of said separate drain nodes its drain node is connected to;
(iii) a third location to identify which of said separate source nodes its source node is connected to.

15. The method of claim 14 wherein said generic description of a layout for said circuit structure also identifies for each transistor within said circuit structure whether or not its drain is connected to its source.

16. The method of claim 14 wherein said generic description of a layout for said circuit structure also identifies for each transistor within said circuit structure whether or not its drain is connected to its gate.

17. The method of claim 11 wherein each characteristic description of each transistor within said circuit structure further comprises:
a) a first component that characterizes the speed of its corresponding transistor;
b) a second component that characterizes the gain of its corresponding transistor; and,
c) a third component that characterizes a current density of its corresponding transistor.

18. The method of claim 17 wherein said first component defines a gate finger length for said corresponding transistor.

19. The method of claim 17 wherein said second component defines a finger width for said corresponding transistor.

20. The method of claim 17 wherein said second component defines a number of fingers for said corresponding transistor.

21. The method of claim 17 wherein said second component defines the aspect ratio at which multiple fingers are to be laid out for said corresponding transistor.

22. The method of claim 17 wherein said current density is a source node current density.

23. The method of claim 17 wherein said current density is a drain node current density.

24. The method of claim 17 wherein each characteristic description of each transistor within said circuit structure further comprises a fourth component that characterizes whether or not a dummy element is to be utilized in the construction of its corresponding transistor.

25. The method of claim 11 wherein said circuit structure is selected from the group consisting of:
   (a) only a transistor,
   (b) only a diode,
   (c) only a capacitor,
   (d) only a differential load,
   e) only a current mirror; and,
   (f) only a differential pair.

26. The method of claim 25 wherein said fetching a profile further comprises fetching a profile from a database having a plurality of profiles, each of said profiles containing specific design rules for its own manufacturing a process.

27. The method of claim 25 wherein said profile contains specific design rules for the following design rule parameters:
   1. the a minimum width of Metal 1;
   2. a minimum spacing between two Metal 1 wires.

28. The method of claim 25 wherein said syntax further comprises:
   for each transistor within said circuit structure:
      a first location to identify which of said separate gate nodes its gate node is connected to;
      (ii) a second location to identify which of said separate drain nodes its drain node is connected to;
      (iii) a third location to identify which of said separate source nodes its source node is connected to.

29. The method of claim 11 wherein said generic description of a layout for said circuit structure also identifies for each transistor within said circuit structure whether or not its drain is connected to its source.

30. The method of claim 11 wherein said generic description of a layout for said circuit structure also identifies for each transistor within said circuit structure whether or not its drain is connected to its gate.

31. The method of claim 25 wherein each characteristic description of each transistor within said circuit structure further comprises:
   a) a first component that characterizes the speed of its corresponding transistor;
   b) a second component that characterizes the gain of its corresponding transistor; and,
   c) a third component that characterizes a current density of its corresponding transistor.

32. The method of claim 31 wherein said first component defines a gate finger length for said corresponding transistor.

33. The method of claim 31 wherein said second component defines a finger width for said corresponding transistor.

34. The method of claim 31 wherein said second component defines a number of fingers for said corresponding transistor.

35. The method of claim 31 wherein said second component defines the aspect ratio at which multiple fingers are to be laid out for said corresponding transistor.

36. The method of claim 31 wherein said current density is a source node current density.

37. The method of claim 31 wherein said current density is a drain node current density.

38. The method of claim 31 wherein each characteristic description of each transistor within said circuit structure further comprises a fourth component that characterizes whether or not a dummy element is to be utilized in the construction of its corresponding transistor.

39. A machine readable medium having stored thereon instructions which when executed by a processing core cause said processing core to perform a method, said method comprising:
   fetching a profile of a manufacturing process that is to be used to manufacture a circuit structure, said profile containing specific design rules of said manufacturing process;
   fetching a generic description of a layout for said circuit structure, said generic description describing said layout without reference to specific design rules of said manufacturing process, said generic description written according to a syntax, said syntax comprising:
      a first location to identify the number of separate gate nodes within said circuit structure;
      a second location to identify the number of separate drain nodes within said circuit structure;
      a third location to identify the number of separate source nodes within said circuit structure; and,
   using said profile, said generic description and a characteristic description of each transistor in said circuit structure to generate a layout for said circuit structure that is targeted for said manufacturing process.

40. The machine readable medium of claim 39 wherein said method further comprises, fetching a profile further comprises fetching a profile from a database having a plurality of profiles, each of said profiles containing specific design rules for its own manufacturing a process.

41. The machine readable medium of claim 39 wherein said profile contains specific design rules for the following design rule parameters:
   1. a minimum width of Metal 1;
   2. a minimum spacing between two Metal 1 wires.

42. The machine readable medium of claim 39 wherein said syntax further comprises:
   for each transistor within said circuit structure:
      (i) a first location to identify which of said separate gate nodes its gate node is connected to;
      (ii) a second location to identify which of said separate drain nodes its drain node is connected to;
      (iii) a third location to identify which of said separate source nodes its source node is connected to.

43. The machine readable medium of claim 39 wherein said generic description of a layout for said circuit structure also identifies for each transistor within said circuit structure whether or not its drain is connected to its source.

44. The machine readable medium of claim 39 wherein said generic description of a layout for said circuit structure also identifies for each transistor within said circuit structure whether or not its drain is connected to its gate.

45. The machine readable medium of claim 39 wherein each characteristic description of each transistor within said circuit structure further comprises:
   a) a first component that characterizes the speed of its corresponding transistor;
   b) a second component that characterizes the gain of its corresponding transistor; and
   c) a third component that characterizes a current density of its corresponding transistor., 46. The machine readable medium of claim 45 wherein said first component defines a gate finger length for said corresponding transistor.

47. The machine readable medium of claim 45 wherein said second component defines a finger width for said corresponding transistor.

48. The machine readable medium of claim 45 wherein said second component defines a number of fingers for said corresponding transistor.

49. The machine readable medium of claim 45 wherein said second component defines the aspect ratio at which multiple fingers are to be laid out for said corresponding transistor.

50. The machine readable medium of claim 45 wherein said current density is a source node current density.

51. The machine readable medium of claim 45 wherein said current density is a drain node current density.

52. The machine readable medium of claim 45 wherein each characteristic description of each transistor within said circuit structure further comprises a fourth component that characterizes whether or not a dummy element is to be utilized in the construction of its corresponding transistor.

53. The machine readable medium of claim 39 wherein said circuit structure is selected from the group consisting of:
   a) only a transistor,
   b) only a diode,
   c) only a capacitor,
   d) only a differential load,
   e) only a current mirror, and,
   f) only a differential pair.

54. The machine readable medium of claim 53 wherein said fetching a profile further comprises fetching a profile from a database having a plurality of profiles, each of said profiles containing specific design rules for its own manufacturing a process.

55. The machine readable medium of claim 53 wherein said profile contains specific design rules for the following design rule parameters:
   1. a minimum width of Metal 1;
   2. a minimum spacing between two Metal 1 wires.

56. The machine readable medium of claim 53 wherein said syntax further comprises:
   for each transistor within said circuit structure:
      (i) a first location to identify which of said separate gate nodes its gate node is connected to;
      (ii) a second location to identify which of said separate drain nodes its drain node is connected to;
      (iii) a third location to identify which of said separate source nodes its source node is connected to.

57. The machine readable medium of claim 56 wherein said generic description of a layout for said circuit structure also identifies for each transistor within said circuit structure whether or not its drain is connected to its source.

58. The machine readable medium of claim 56 wherein said generic description of a layout for said circuit structure also identifies for each transistor within said circuit structure whether or not its drain is connected to its gate.

59. The machine readable medium of claim 53 wherein each characteristic description of each transistor within said circuit structure further comprises:
   a) a first component that characterizes the speed of its corresponding transistor;
   b) a second component that characterizes the gain of its corresponding transistor; and,
   c) a third component that characterizes a current density of its corresponding transistor.

60. The machine readable medium of claim 59 wherein said first component defines a gate finger length for said corresponding transistor.

61. The machine readable medium of claim 59 wherein said second component defines a finger width for said corresponding transistor.

62. The machine readable medium of claim 59 wherein said second component defines a number of fingers for said corresponding transistor.

63. The machine readable medium of claim 59 wherein said second component defines the aspect ratio at which multiple fingers are to be laid out for said corresponding transistor.

64. The machine readable medium of claim 59 wherein said current density is a source node current density.

65. The machine readable medium of claim 59 wherein said current density is a drain node current density.

66. The machine readable medium of claim 59 wherein each characteristic description of each transistor within said circuit structure further comprises a fourth component that characterizes whether or not a dummy element is to be utilized in the construction of its corresponding transistor.

67. A computing system having a processing core of one or more processors, said computing system configured to execute design tool software, said design tool software stored upon a machine readable medium as instructions that, when executed by said one or more processors, cause a method to be performed, said method comprising:
   fetching a profile of a manufacturing process that is to be used to manufacture a circuit structure, said profile containing specific design rules of said manufacturing process;
   fetching a generic description of a layout for said circuit structure, said generic description describing said layout without reference to specific design rules of said manufacturing process, said generic description written according to a syntax, said syntax comprising:
      a first location to identify the number of separate gate nodes within said circuit structure;
      a second location to identify the number of separate drain nodes within said circuit structure;
      a third location to identify the number of separate source nodes within said circuit structure; and,
   using said profile, said generic description and a characteristic description of each transistor in said circuit structure to generate a layout for said circuit structure that is targeted for said manufacturing process.

* * * * *

UNITED STATES PATENT AND TRADEMARK OFFICE
CERTIFICATE OF CORRECTION

PATENT NO. : 6,789,246 B1 Page 1 of 1
APPLICATION NO. : 10/119326
DATED : September 7, 2004
INVENTOR(S) : Sunderarajan Mohan et al.

It is certified that error appears in the above-identified patent and that said Letters Patent is hereby corrected as shown below:

ON THE COVER PAGE:

(75) Inventors: "Sunderarjan" should read --Sunderarajan--

Signed and Sealed this

Twentieth Day of November, 2007

JON W. DUDAS
*Director of the United States Patent and Trademark Office*